(12) United States Patent
Luo

(10) Patent No.: US 11,081,654 B2
(45) Date of Patent: Aug. 3, 2021

(54) BLUE LIGHT TADF MATERIAL, PREPARATION METHOD THEREOF AND ELECTROLUMINESCENT DEVICE

(71) Applicant: Wuhan China Star Optoelectronics Semiconductor Display Technology Co., Ltd., Wuhan (CN)

(72) Inventor: Jiajia Luo, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 344 days.

(21) Appl. No.: 16/326,714

(22) PCT Filed: Dec. 12, 2018

(86) PCT No.: PCT/CN2018/120740
§ 371 (c)(1),
(2) Date: Feb. 20, 2019

(87) PCT Pub. No.: WO2020/113643
PCT Pub. Date: Jun. 11, 2020

(65) Prior Publication Data
US 2020/0176687 A1 Jun. 4, 2020

(30) Foreign Application Priority Data
Dec. 4, 2018 (CN) .......................... 201811475447.9

(51) Int. Cl.
*H01L 51/00* (2006.01)
(52) U.S. Cl.
CPC ...... *H01L 51/0072* (2013.01); *H01L 51/0003* (2013.01); *H01L 51/0094* (2013.01)

(58) Field of Classification Search
CPC ............ H01L 51/0072; H01L 51/0003; H01L 51/0094; H01L 51/5012
USPC ......................................................... 428/690
See application file for complete search history.

(56) References Cited

U.S. PATENT DOCUMENTS

| 10,193,079 B2 * | 1/2019 | Stoessel ................. C09K 11/06 |
| 2016/0072076 A1 * | 3/2016 | Stoessel ............... C07D 487/04 257/40 |

FOREIGN PATENT DOCUMENTS

| CN | 105051014 A | * | 11/2015 | ......... C07D 491/048 |
| CN | 106946850 A | * | 7/2017 | ............ C07D 401/14 |
| CN | 108484592 A1 | * | 9/2018 | ............ C07D 209/86 |
| WO | WO-2017216299 A1 | * | 12/2017 | ............ C07D 279/22 |

OTHER PUBLICATIONS

CAS reg. No. 2374790-36-8, Sep. 9, 2019. (Year: 2019).*

* cited by examiner

*Primary Examiner* — Douglas J McGinty

(57) ABSTRACT

The present invention provides a blue light thermally activated delayed fluorescence (TADF) material, a preparation method thereof, and an electroluminescent device. The blue TADF material achieves high luminous efficiency and TADF efficiency to realize excellent solubility by attaching an alkyl chain for increasing solubility to a periphery of the blue light TADF material, and by attaching a tert-butylcarbazole unit having a high energy state to an end of the alkyl chain of the blue light TADF material, thereby allowing the material to be processed by solution spin coating, and the terminal carbazole can act as a host, enabling non-doping of a luminescent layer while effectively avoiding phase separation.

12 Claims, 3 Drawing Sheets

BLUE LIGHT TADF MATERIAL, PREPARATION METHOD THEREOF AND ELECTROLUMINESCENT DEVICE

RELATED APPLICATIONS

This application is a National Phase of PCT Patent Application No. PCT/CN2018/120740 having International filing date of Dec. 12, 2018, which claims the benefit of priority of Chinese Patent Application No. 201811475447.9 filed on Dec. 4, 2018. The contents of the above applications are all incorporated by reference as if fully set forth herein in their entirety.

FIELD AND BACKGROUND OF THE INVENTION

The present invention relates to a field of display technologies, and in particular, to a blue light thermally activated delayed fluorescence (TADF) material, a method of preparing the same, and an electroluminescent device.

It is known that organic light-emitting diodes (OLEDs) have attracted the attention of many researchers, due to their huge application prospects and advantages, such as self-illumination without the need for a backlight, high luminous efficiency, large viewing angles, a fast response speed, a wide temperature adaptation range, relatively simple production and processing techniques, low driving voltage, low energy consumption, lightness, thinness, flexibility, and so on.

A conventional OLED display device generally includes a substrate, an anode disposed on the substrate, an organic light-emitting layer disposed on the anode, an electron transport layer disposed on the organic light-emitting layer, and a cathode disposed on the electron transport layer. During operation, holes from the cathode and electrons from the anode are emitted to the organic light-emitting layer, and these electrons and holes are combined to generate an excited electron-hole pair, and the excited electron-hole pair is converted from an excited state to a ground state to realize light-emitting.

In OLEDs, the dominant luminescent guest material is critical. Guest luminescent materials for early OLEDs are fluorescent materials. Because a ratio of excitons in a singlet energy state and excitons in a triplet energy state in the OLED is 1:3, the theoretical internal quantum efficiency (IQE) of fluorescent-based OLEDs can merely reach 25%, thus considerably limiting the application of fluorescent electroluminescent devices. Heavy metal complex phosphorescent materials can achieve 100% IQE by using the excitons in the singlet energy state and the excitons in the triplet energy state due to a spin-orbit coupling of heavy atoms. However, heavy metals commonly employed are precious metals, such as Ir, Pt, and the like, and the heavy metal complex phosphorescent materials have yet to be developed in fields of blue light materials.

Through molecular design, pure organic thermally activated delayed fluorescence (TADF) materials can have a small minimum energy state difference ($\Delta E_{ST}$) between the singlet energy state and the triplet energy state, so that the excitons in the triplet energy state can be returned by reverse intersystem crossing (RISC) back to the singlet energy state, then to the ground state by radiation transition to emit light, and thereby simultaneously use the excitons in the singlet energy state and in the triplet energy state, and 100% IQE may be also achieved.

For TADF materials, a fast reverse intersystem crossing constant (kRISC) and high photoluminescence quantum yield (PLQY) are necessary for a preparation of high efficiency OLEDs. At present, TADF materials with the above conditions are still relatively scarce compared to heavy metal Ir complexes. In the blue light field where phosphorescent heavy metal materials have yet to be developed, and there are few TADF materials. Meanwhile, most of the TADF materials are processed by vacuum deposition, which is complex, requires high energy, and has a low material utilization rate, thus greatly limiting applications of TADF materials.

SUMMARY OF THE INVENTION

An object of the present invention is to provide a blue light TADF material which has remarkable TADF characteristics, high synthesis efficiency, and can be processed by solution spin coating.

Another object of the present invention is to provide a method of preparing a blue light TADF material with high synthesis efficiency, and the obtained blue light TADF material has remarkable TADF characteristics and can be processed by solution spin coating.

Still another object of the present invention is to provide an electroluminescent device having high luminous efficiency with a low production cost.

In order to achieve the above objects, the present invention provides a blue light TADF material having a chemical structure of generic Formula 1:

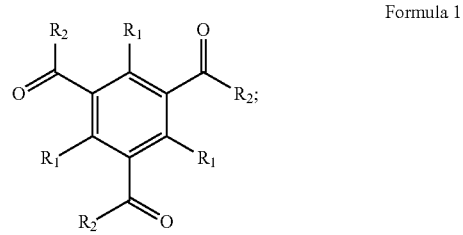

Formula 1 wherein $R_1$ is one of chemical structures of Formula 2 to Formula 14:

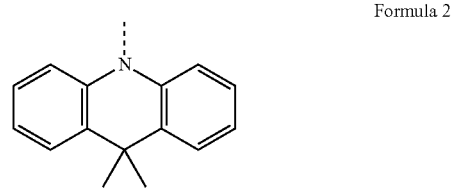

Formula 2

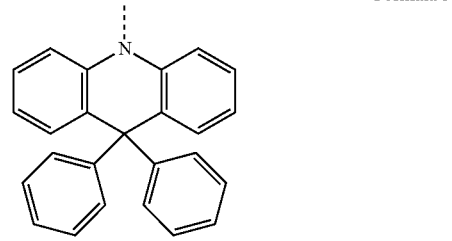

Formula 3

Formula 4
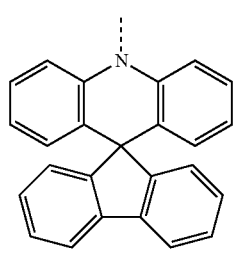
Formula 5
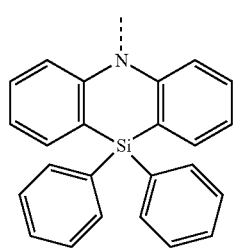
Formula 6
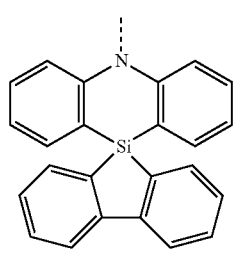
Formula 7
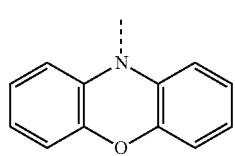
Formula 8
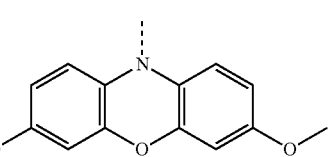
Formula 9
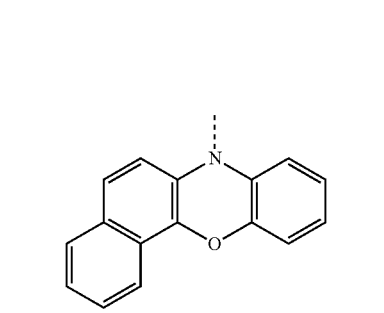
Formula 10
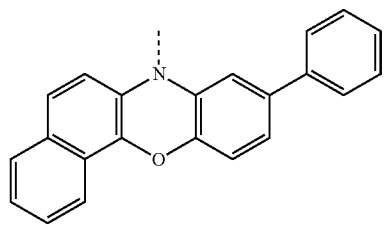
Formula 11
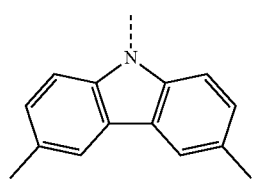
Formula 12
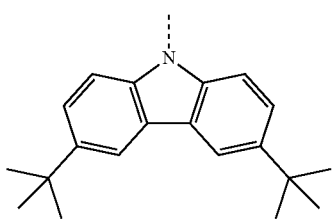
Formula 13
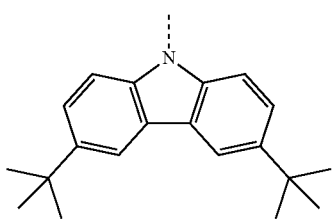
Formula 14
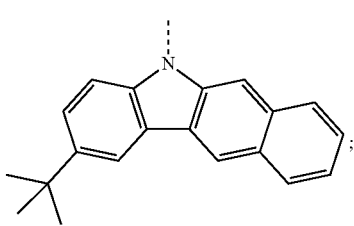

$R_2$ is one of chemical structures of Formula 15 to Formula 19.
Formula 15
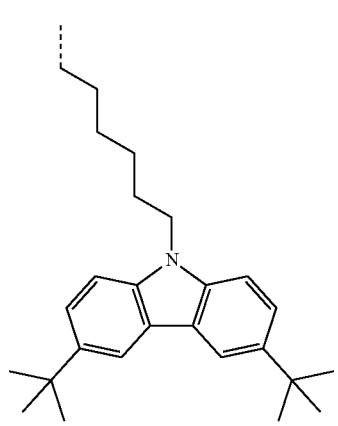
Formula 16
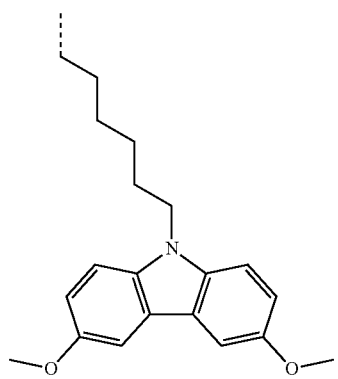
Formula 17
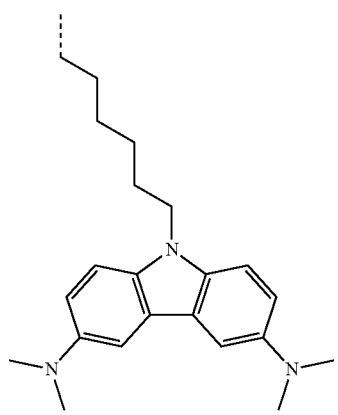
Formula 18
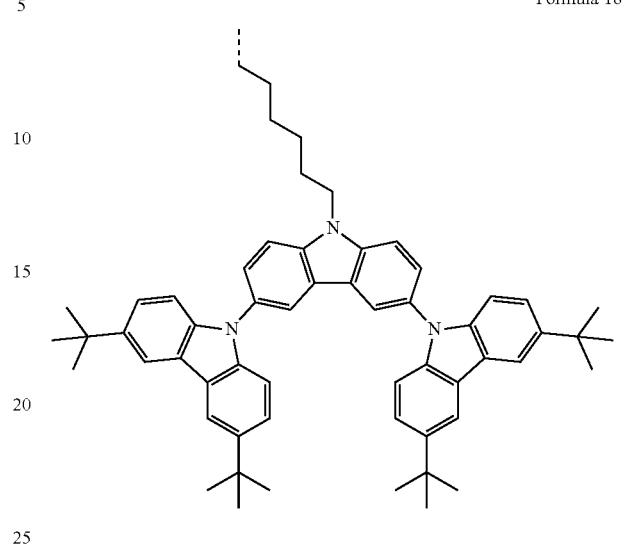
Formula 19
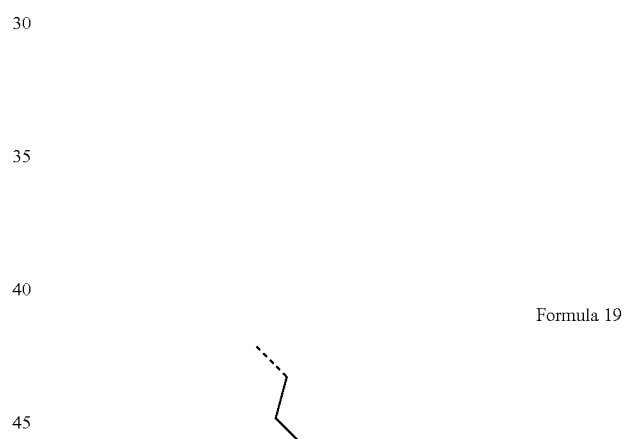

Optionally, the blue light TADF material has one of structures of Formula 20 to Formula 22:
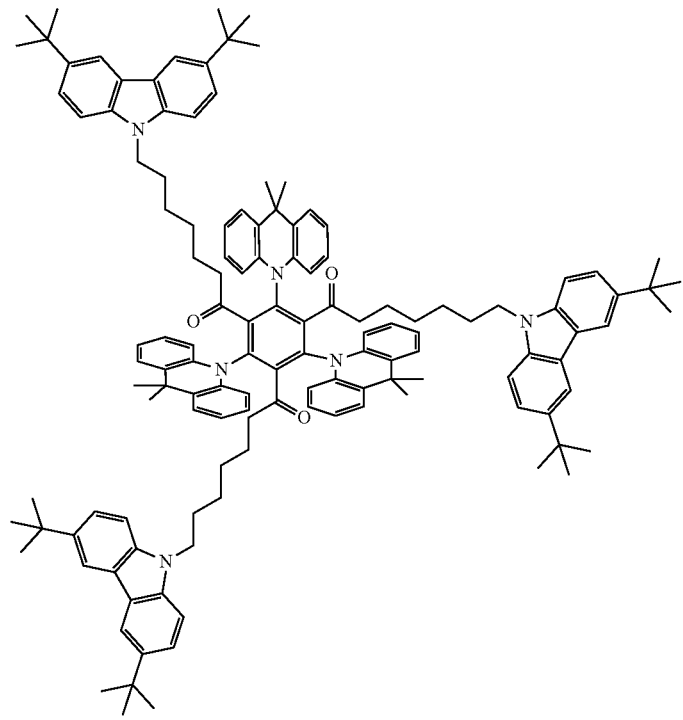
Formula 20
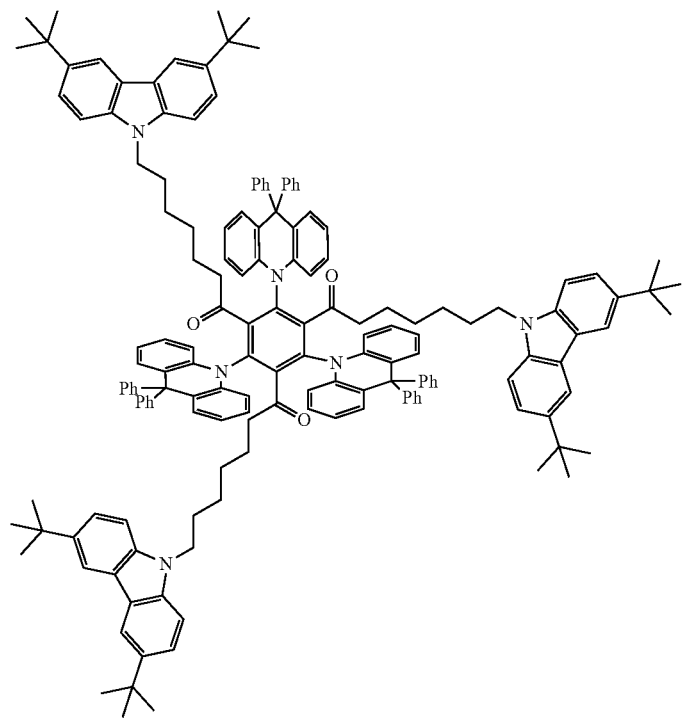
Formula 21

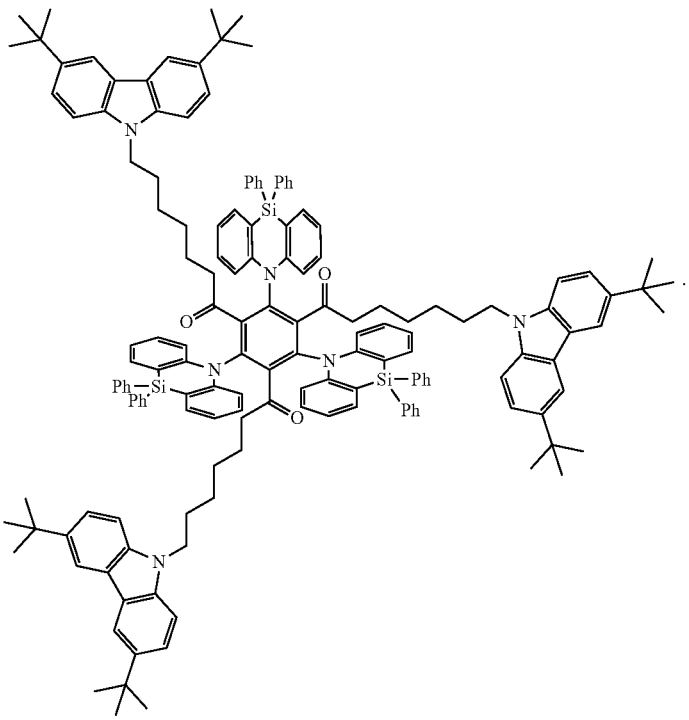

Formula 22

The blue light TADF material is processable by solution spin coating.

The present invention also provides a method of preparing a blue light TADF material, comprising the following steps:

Step $S_1$, providing a reaction vessel, and adding a first reactant R1 to the reaction vessel, wherein the first reactant $R_1$ has one of chemical structures of Formula 2 to Formula 14:

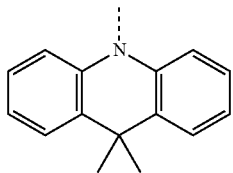

Formula 2

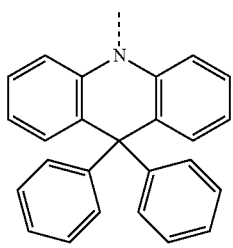

Formula 3

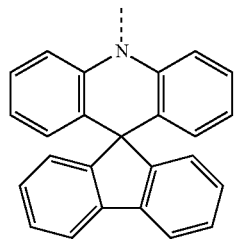

Formula 4

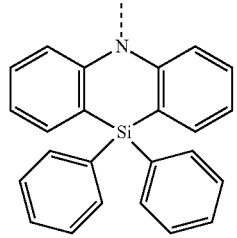

Formula 5

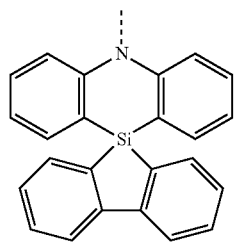

Formula 6

-continued

Formula 7
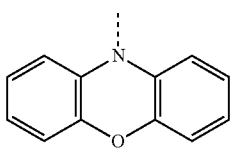

Formula 8
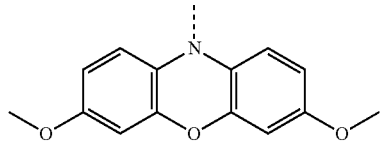

Formula 9
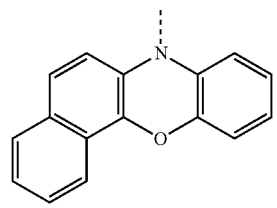

Formula 10
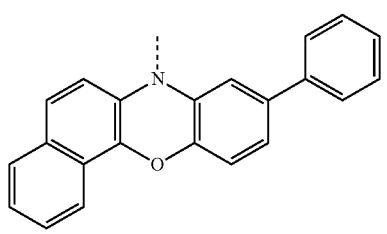

Formula 11
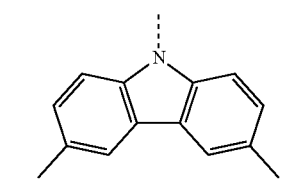

Formula 12
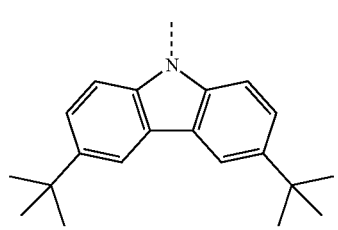

Formula 13
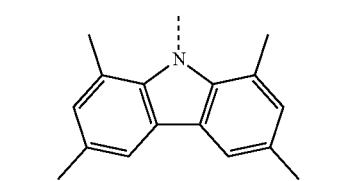

Formula 14
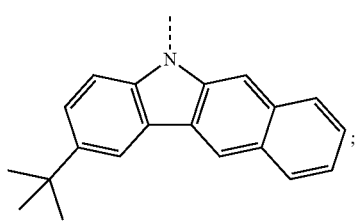

Step S2, removing air in the reaction vessel, and adding sodium hydride and tetrahydrofuran to the reaction vessel for reaction at a first temperature for a first period of time;

Step S3, providing a second reactant, and adding the second reactant to the reaction vessel for reaction for a second period of time to obtain a reaction solution, wherein the second reactant has a chemical structure of generic Formula 23;

Formula 23
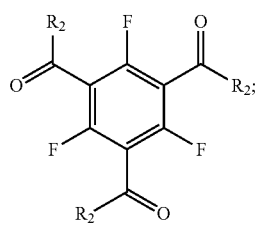

wherein $R_2$ has one of chemical structures of Formula 15 to Formula 19:

Formula 15
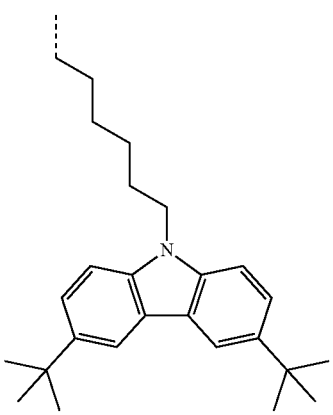

Formula 16
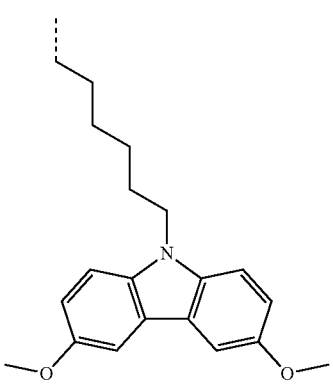

Formula 17

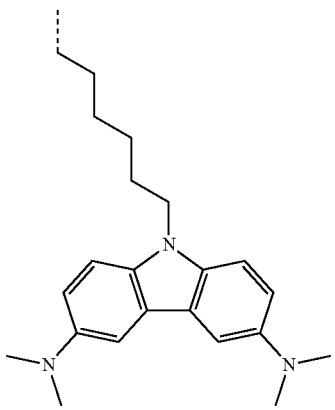

Formula 18

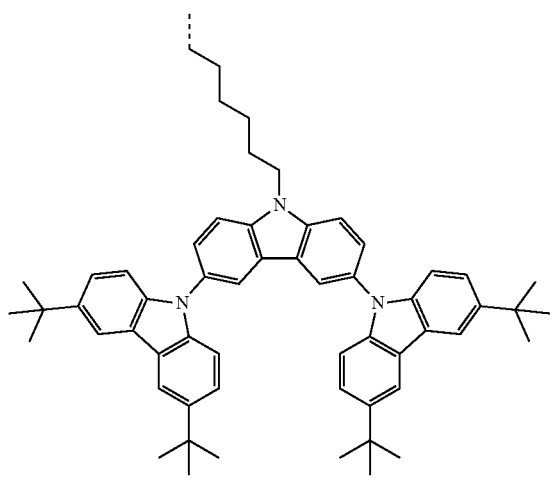

Formula 19

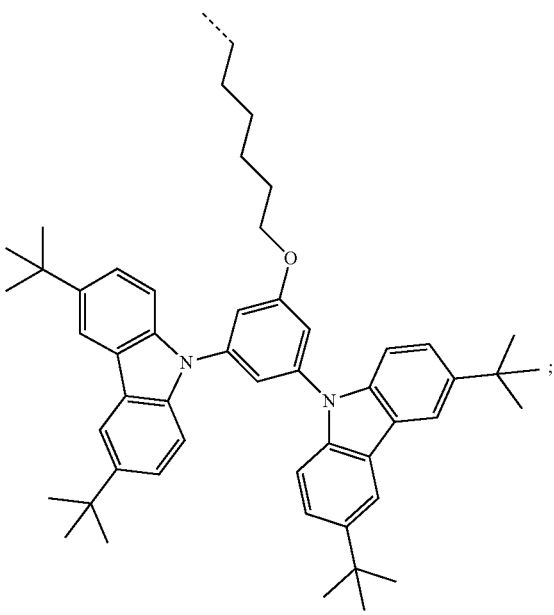

Step S4, pouring the reaction solution into water, followed by a series of separation and purification comprising extraction, combining organic extract, rotary distillation and column chromatography, to obtain a blue light TADF material, wherein the blue light TADF material has a chemical structure as follows:

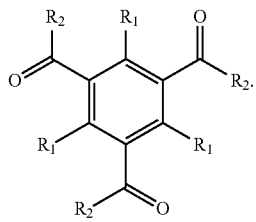

The first temperature is from 55° C. to 65° C., and the first period of time is from 1.5 hours to 2.5 hours.

The second period of time is from 22 hours to 26 hours.

The extraction is carried out using dichloromethane in the step S4.

The blue TADF material obtained in the step S4 is processable by solution spin coating.

The present invention still provides an electroluminescent device comprising the blue light TADF material.

The electroluminescent device comprises a light-emitting layer fabricated by using the blue light TADF material.

Advantageous effects of invention: The blue TADF material achieves high luminous efficiency and TADF efficiency, to realize an excellent solubility by attaching an alkyl chain for increasing solubility to a periphery of the blue light TADF material, and by attaching a tert-butylcarbazole unit having a high energy state to an end of an alkyl chain of the blue light TADF material, thereby allowing the material to be processed by solution spin coating, and the terminal carbazole can act as a host, enabling non-doping of the luminescent layer while effectively avoiding phase separation. The present invention also provides a method of preparing a blue light TADF material with high synthesis efficiency, and the obtained blue light TADF material has remarkable TADF characteristics and can be processed by solution spin coating. The present invention still provides an electroluminescent device having high luminous efficiency with a low production cost.

BRIEF DESCRIPTION OF THE SEVERAL VIEWS OF THE DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DESCRIPTION OF SPECIFIC EMBODIMENTS OF THE INVENTION

In order to further clarify the technical means and effects of the present invention, the following detailed description will be made in conjunction with the preferred embodiments of the present invention and the accompanying drawings.

The present invention first provides a blue light thermally activated delayed fluorescence (TADF) material, comprising a structure of generic Formula 1:

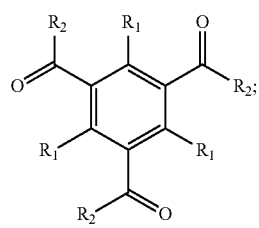

Formula 1 wherein R1 is one of chemical structures of Formula 2 to Formula 14:

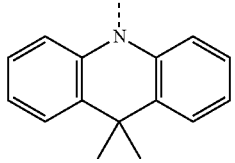

Formula 2

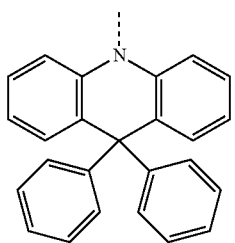

Formula 3

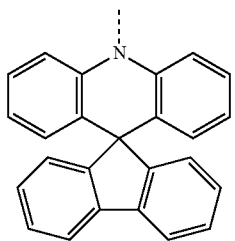

Formula 4

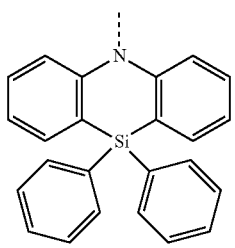

Formula 5

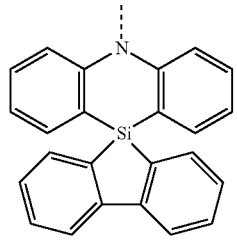

Formula 6

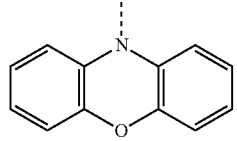

Formula 7

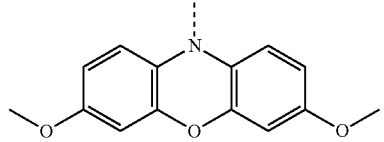

Formula 8

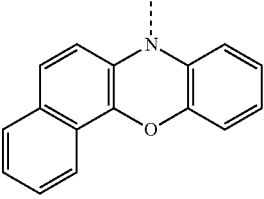

Formula 9

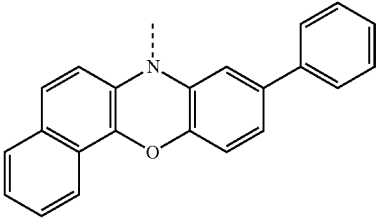

Formula 10

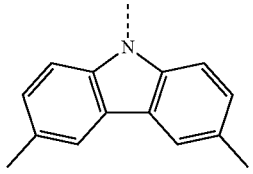

Formula 11

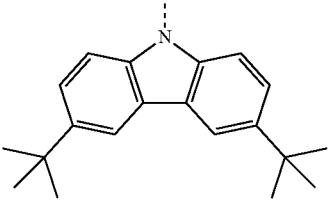

Formula 12

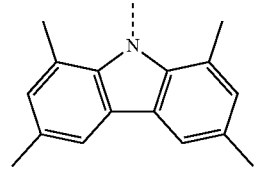

Formula 13

Formula 14
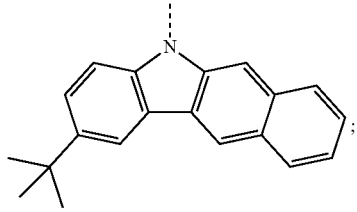
$R_2$ is one of chemical structures of Formula 15 to Formula 19.
Formula 15
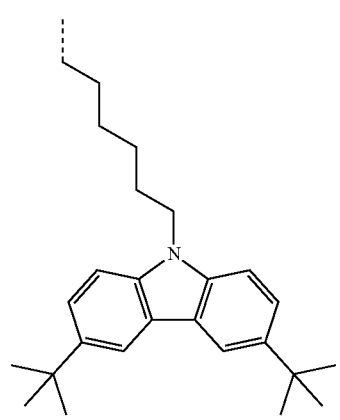
Formula 16
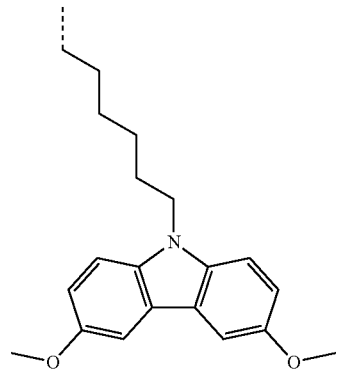
Formula 17
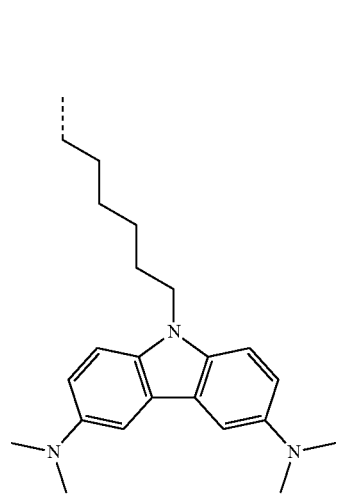
Formula 18
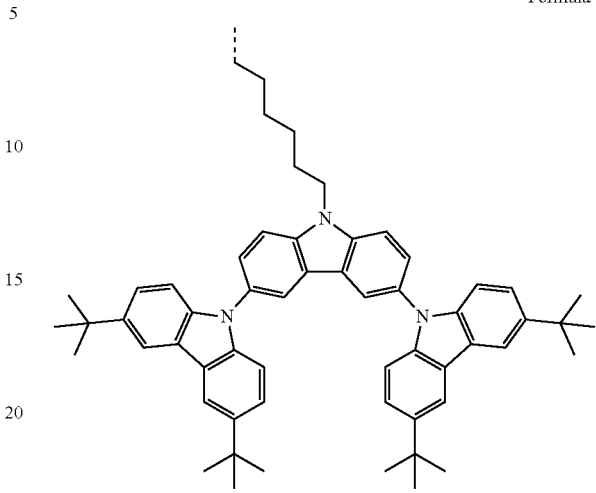
Formula 19
Preferably, in a first to third embodiments of the present invention, the blue light TADF materials respectively have chemical structures of Formula 20 to Formula 22:

Formula 20
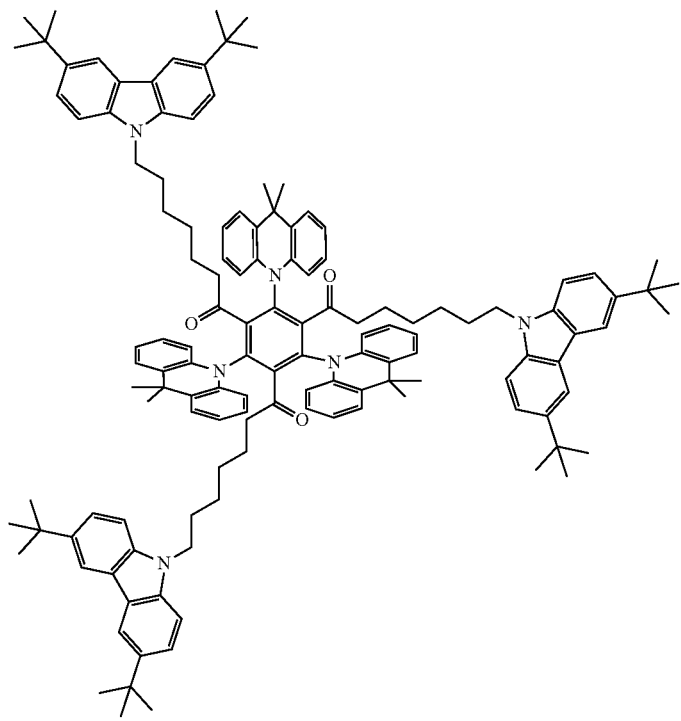
Formula 21
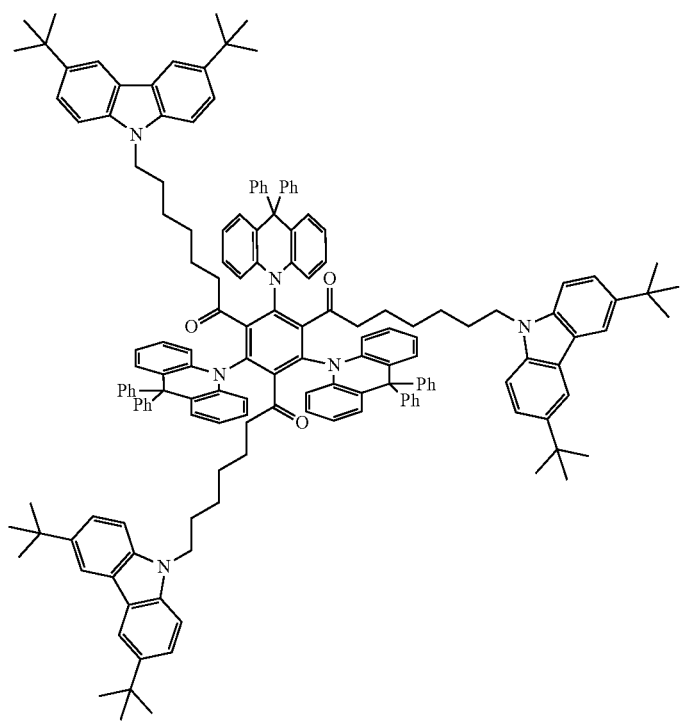

-continued

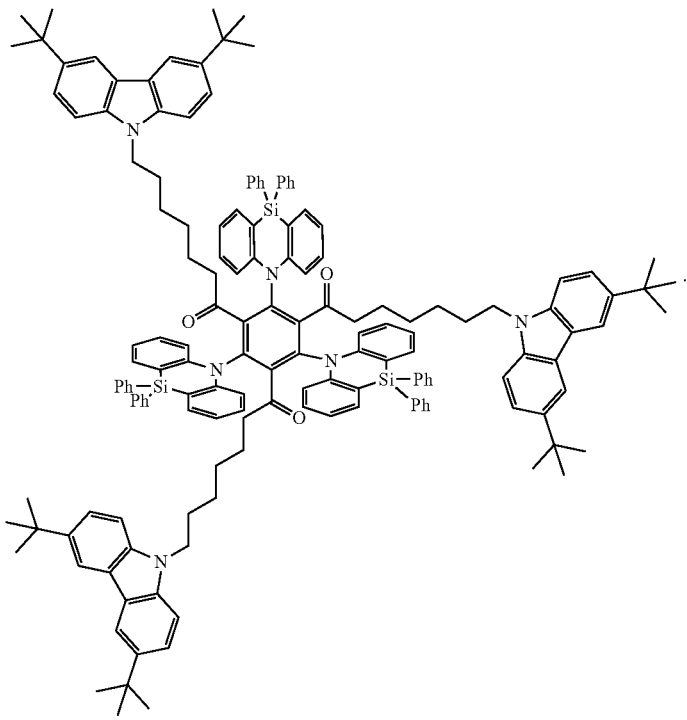

Formula 22

It should be noted that the above-mentioned blue light TADF material achieves high luminous efficiency and TADF efficiency to realize excellent solubility by attaching an alkyl chain for increasing solubility to a periphery of the blue light TADF material, and by attaching a tert-butylcarbazole unit having a high energy state to an end of the alkyl chain of the blue light TADF material, thereby allowing the material to be processed by solution spin coating, and the terminal carbazole can act as a host, enabling non-doping of a luminescent layer while effectively avoiding phase separation. An electroluminescent device using the above-mentioned blue light TADF material as a light-emitting layer has high luminous efficiency and TADF efficiency.

Figure 1:
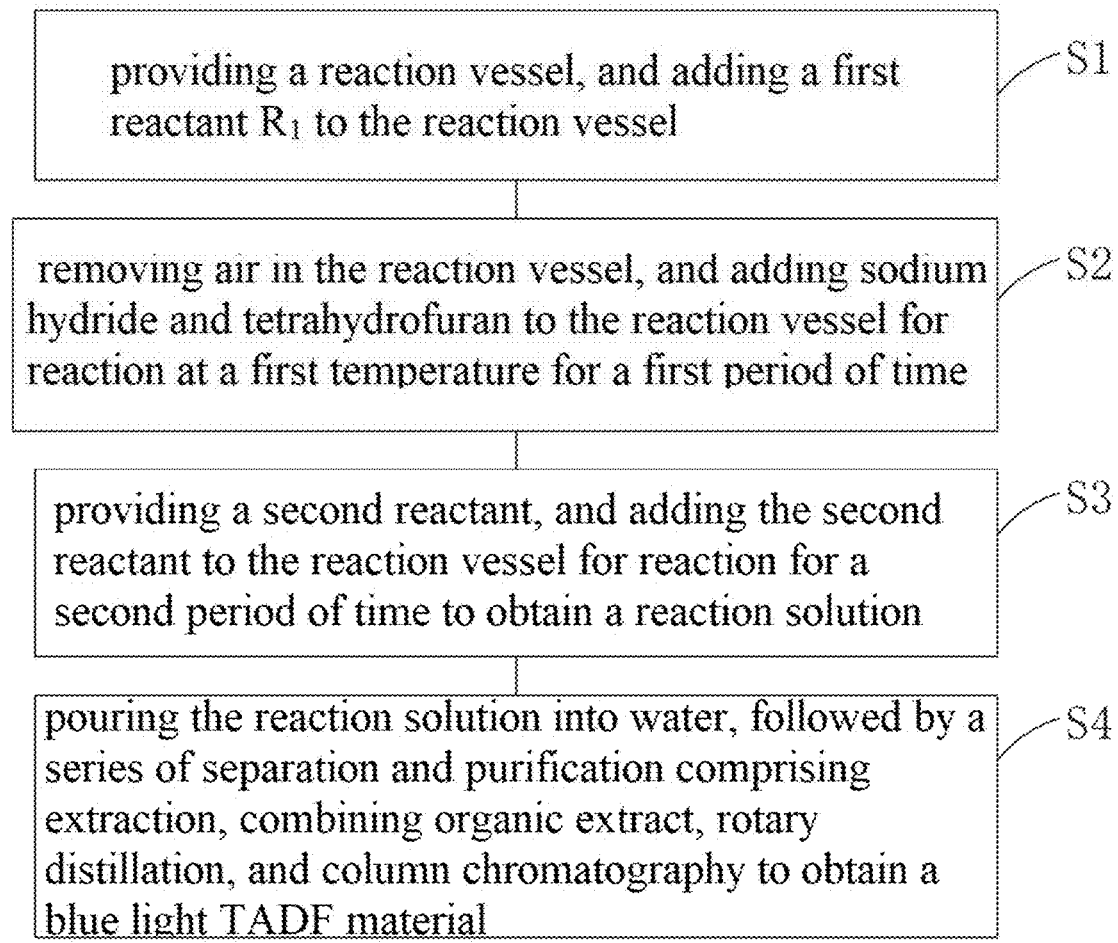
FIG. 1 is a flow chart of a method of preparing a blue light thermally activated delayed fluorescence (TADF) material of the present invention.

Referring to FIG. 1, the present invention also provides a method of preparing a blue light TADF material, comprising the following steps:

Step S1, providing a reaction vessel, and adding a first reactant $R_1$ to the reaction vessel, wherein The first reactant $R_1$ has one of chemical structures of Formula 2 to Formula 14:

Formula 2

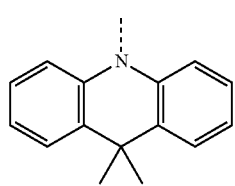

-continued

Formula 3

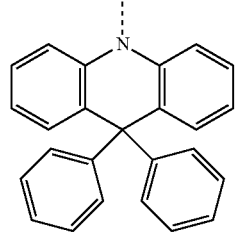

Formula 4

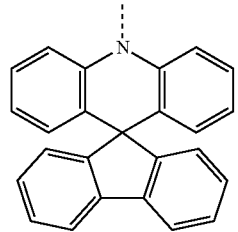

Formula 5

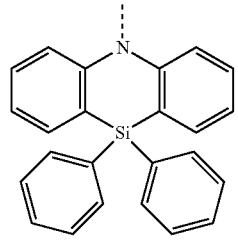

-continued

Formula 6
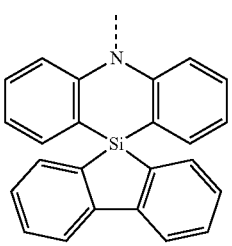

Formula 7
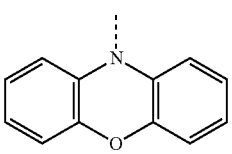

Formula 8
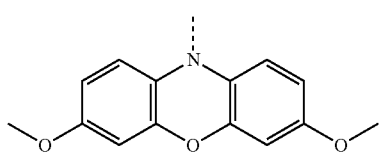

Formula 9
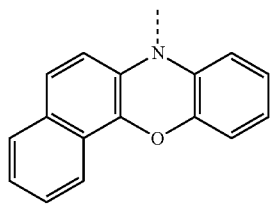

Formula 10
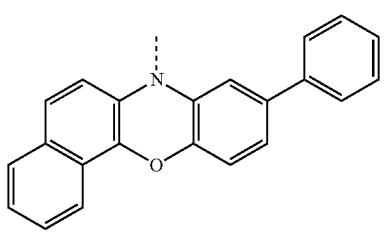

Formula 11
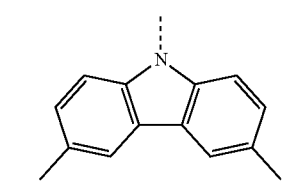

Formula 12
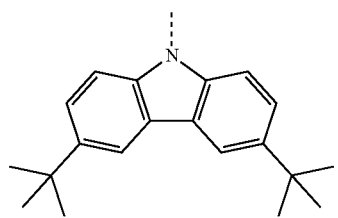

-continued

Formula 13
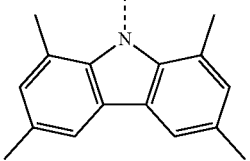

Formula 14
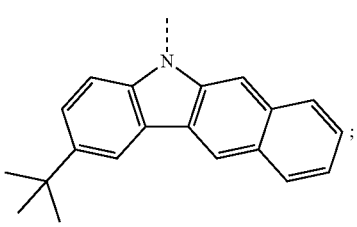

;

Specifically, the reaction vessel is a two-necked bottle.

Step S2, removing air in the reaction vessel, and adding sodium hydride (NaH) and tetrahydrofuran (THF) to the reaction vessel, for reaction at a first temperature for a first period of time.

Specifically, in the step S2, the reaction vessel is placed in a transition chamber of a glove box for suction to remove air in the reaction vessel, and the sodium hydride is placed in the glove box, wherein the addition of sodium hydride to the reaction vessel is completed in the glove box. After the addition of sodium hydride is completed, the reaction vessel is taken out of the glove box, and the reaction vessel is kept isolated from the air while continuing to add tetrahydrofuran to the reaction vessel to complete the reaction.

Preferably, in the step S2, the reaction vessel is placed in the transition chamber of the glove box for suction for three times.

Specifically, the first temperature is 55° C. to 65° C., and the first period of time is 1.5 hours to 2.5 hours. Preferably, the first temperature is 60° C. and the first period of time is 2 hours.

Step S3, providing a second reactant, and adding the second reactant to the reaction vessel, for reaction for a second period to obtain a reaction solution, wherein the second reactant has the chemical structure of generic Formula 23;

Formula 23
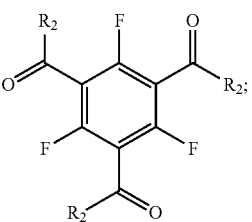

wherein $R_2$ has one of chemical structures of Formula 15 to Formula 19:
Formula 15
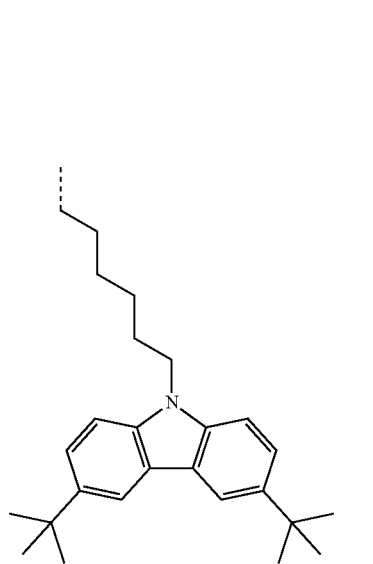
Formula 16
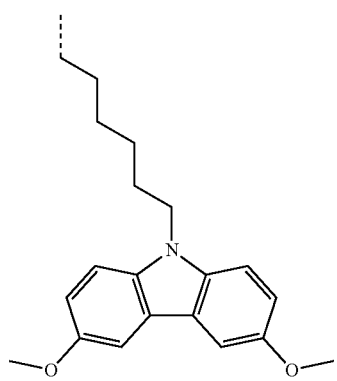
Formula 17
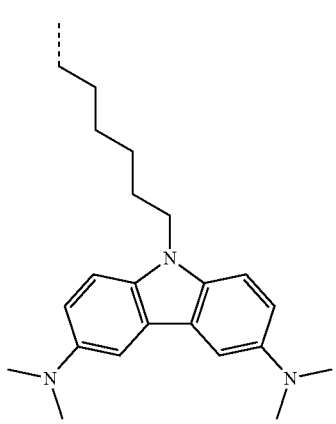
Formula 18
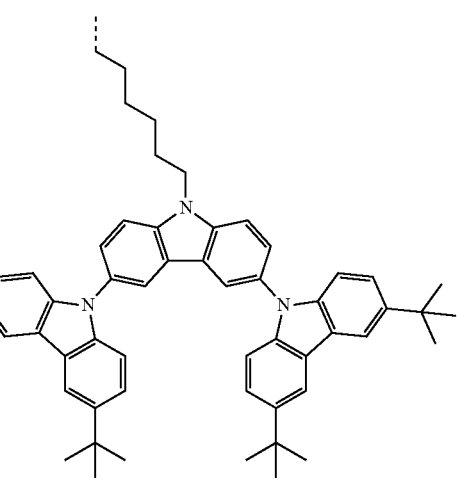

Formula 19

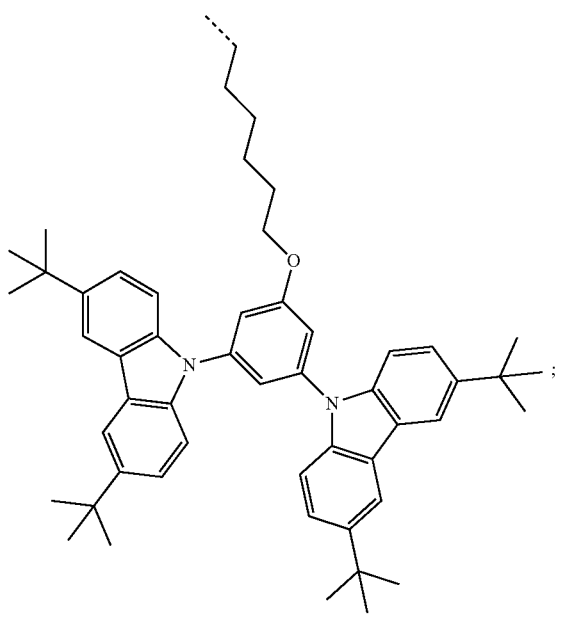

Specifically, the second period of time is 22 hours to 26 hours, and preferably, the second period of time is 24 hours.

Step S4, pouring the reaction solution into water, followed by a series of separation and purification comprising extraction, combining organic extract, rotary distillation, and column chromatography to obtain a blue light TADF material, wherein the blue light TADF material has a chemical structure as follows:

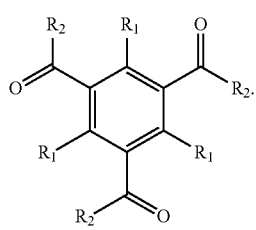

Specifically, in the step S4, the reaction solution was poured into ice water, followed by extraction with dichloromethane for three times.

It should be noted that the above method has a reasonable synthetic scheme and high synthesis efficiency, and the obtained blue TADF material achieves high luminous efficiency and TADF efficiency to realize excellent solubility by attaching an alkyl chain for increasing solubility to a periphery of the blue light TADF material, and by attaching a tert-butylcarbazole unit having a high energy state to an end of the alkyl chain of the blue light TADF material, thereby allowing the material to be processed by solution spin coating, and the terminal carbazole can act as a host, enabling non-doping of the luminescent layer while effectively avoiding phase separation. The electroluminescent device using the above-mentioned blue light TADF material as a light-emitting layer has high luminous efficiency and TADF efficiency.

Specifically, in the first embodiment of the present invention, the method of preparing the blue light TADF material specifically comprises: first, adding a first reactant 9,10-dihydro-9-dimethyl acridine (2.5 g, 12 mmol) having a chemical structure as shown in Formula 2 to a 100 mL two-necked bottle; then, placing the two-necked bottle in a transition chamber of a glove box to remove the air in the two-necked bottle for three times; adding NaH (0.48 g, 60%, 12 mmol) to the two-necked bottle, followed by removing the two-necked bottle from the glove box; and then adding 60 mL of tetrahydrofuran (THF) to the two-necked bottle for reaction at 60° C. for 2 hours; adding a second reactant (3.9 g, 3 mmol) having a chemical structure of Formula 24 thereto for further reaction for 24 hours, followed by cooling the reaction solution to room temperature; and pouring the reaction solution into 200 mL of ice water, followed by extraction with dichloromethane three times; and then combining organic extracts, followed by rotary distillation and column chromatography (dichloromethane:n-hexane, v:v, 1:1) for separation and purification to obtain 3.1 g of a blue TADF material having a chemical structure of Formula 20, which is a blue-white powder. The yield was 55%.

Specifically, a synthetic scheme of the first embodiment of the present invention is as follows:

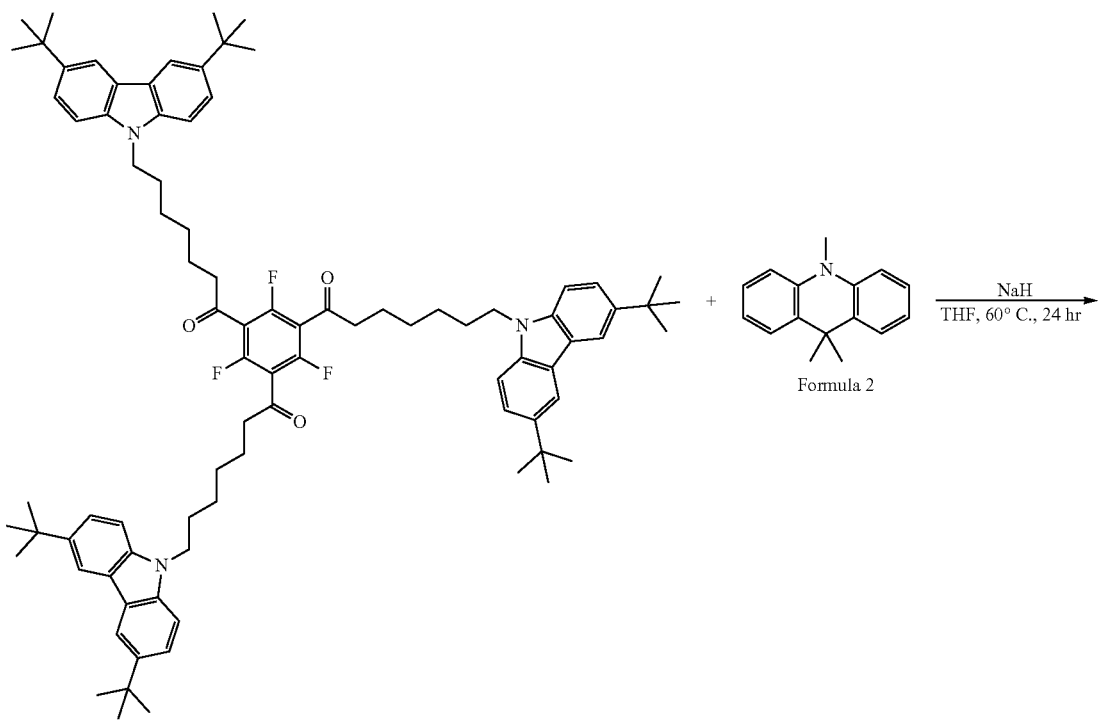
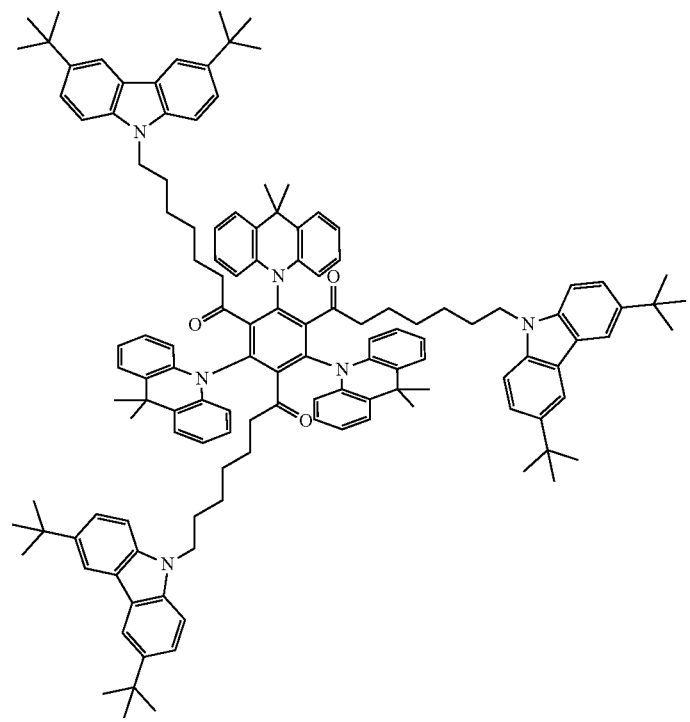

Specifically, in a second embodiment of the present invention, the method of preparing the blue light TADF material specifically comprises: first, adding a first reactant 9,10-dihydro-9,9-diphenyl acridine (4.0 g, 12 mmol) having a chemical structure as shown in Formula 3 to a 100 mL two-necked bottle; then, placing the two-necked bottle in a transition chamber of a glove box to remove the air in the two-necked bottle for three times; adding NaH (0.48 g, 60%, 12 mmol) to the two-necked bottle, followed by removing the two-necked bottle from the glove box; and then adding 60 mL of tetrahydrofuran (THF) to the two-necked bottle for reaction at 60° C. for 2 hours; adding a second reactant (3.9 g, 3 mmol) having a chemical structure of Formula 24 thereto for further reaction for 24 hours, followed by cooling the reaction solution to room temperature; and pouring the reaction solution into 200 mL of ice water, followed by extraction with dichloromethane three times; and then combining organic extracts, followed by rotary distillation and column chromatography (dichloromethane:n-hexane, v:v, 1:1) for separation and purification to obtain 3.5 g of a blue TADF material having a chemical structure of Formula 21, which is a blue-white powder. The yield was 52%.

Specifically, a synthetic scheme of the second embodiment of the present invention is as follows:

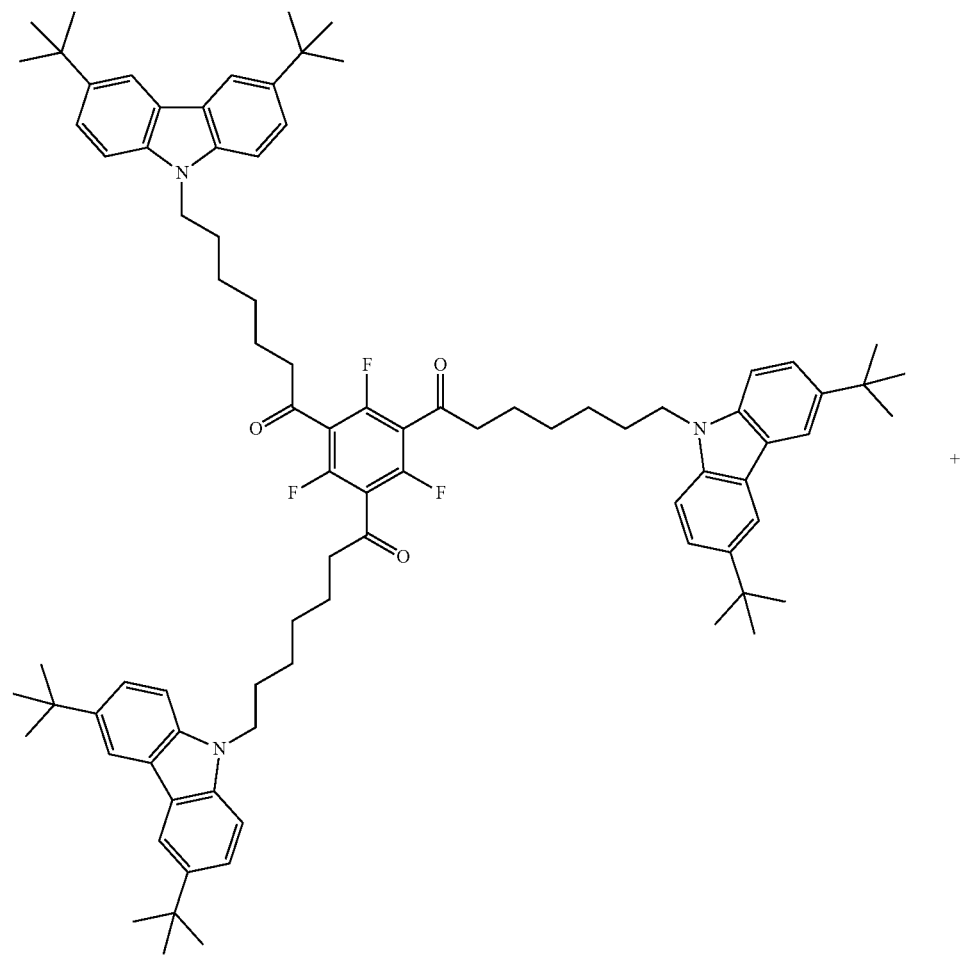

Formula 24

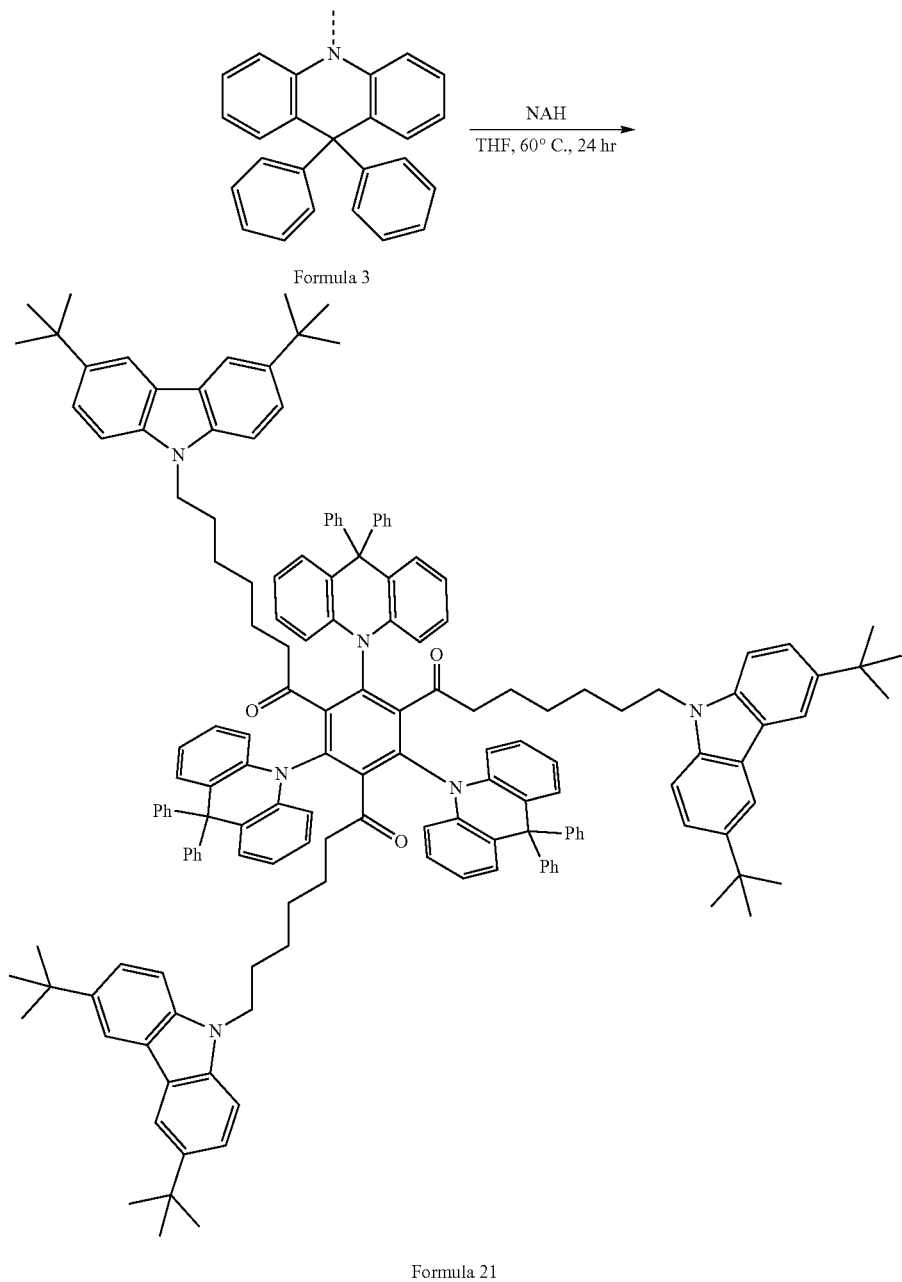

Formula 21

Specifically, in a third embodiment of the present invention, the method of preparing the blue light TADF material specifically comprises: first, adding a first reactant 9,10-dihydro-9,9-diphenylsilyl acridine (4.2 g, 12 mmol) having a chemical structure as shown in Formula 5 to a 100 mL two-necked bottle; then, placing the two-necked bottle in a transition chamber of a glove box to remove the air in the two-necked bottle for three times; adding NaH (0.48 g, 60%, 12 mmol) to the two-necked bottle, followed by removing the two-necked bottle from the glove box; and then adding 60 mL of tetrahydrofuran (THF) to the two-necked bottle for reaction at 60° C. for 2 hours; adding a second reactant (3.9 g, 3 mmol) having a chemical structure of Formula 24 thereto, for further reaction for 24 hours, followed by cooling the reaction solution to room temperature; and pouring the reaction solution into 200 mL of ice water, followed by extraction with dichloromethane three times; and then combining organic extracts, followed by rotary distillation and column chromatography (dichloromethane: n-hexane, v:v, 1:1) for separation and purification to obtain 3.9 g of a blue TADF material having a chemical structure of Formula 22, which is a blue-white powder. The yield was 45%.

Specifically, the synthetic scheme of the third embodiment of the present invention is as follows:
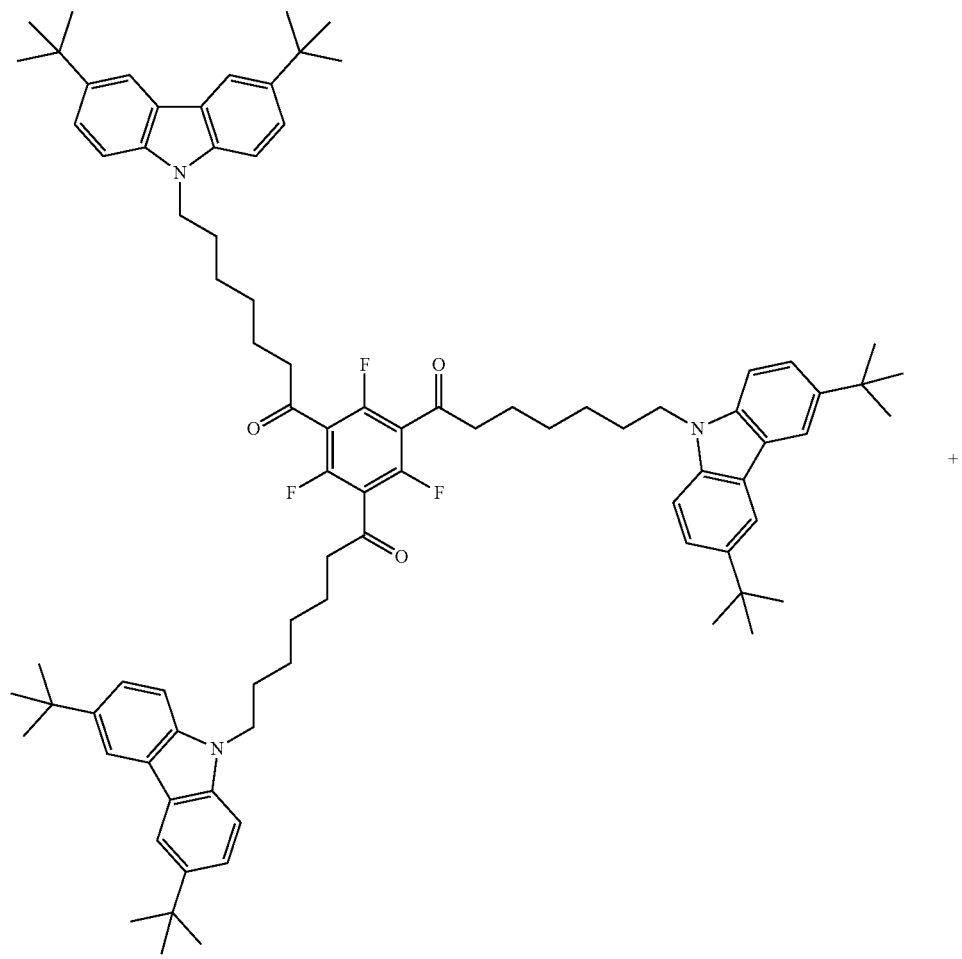
Formula 24
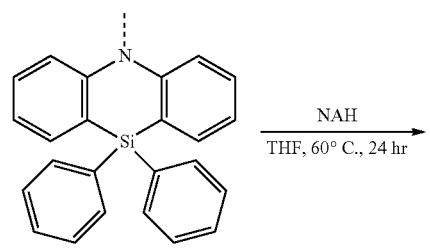
Formula 5

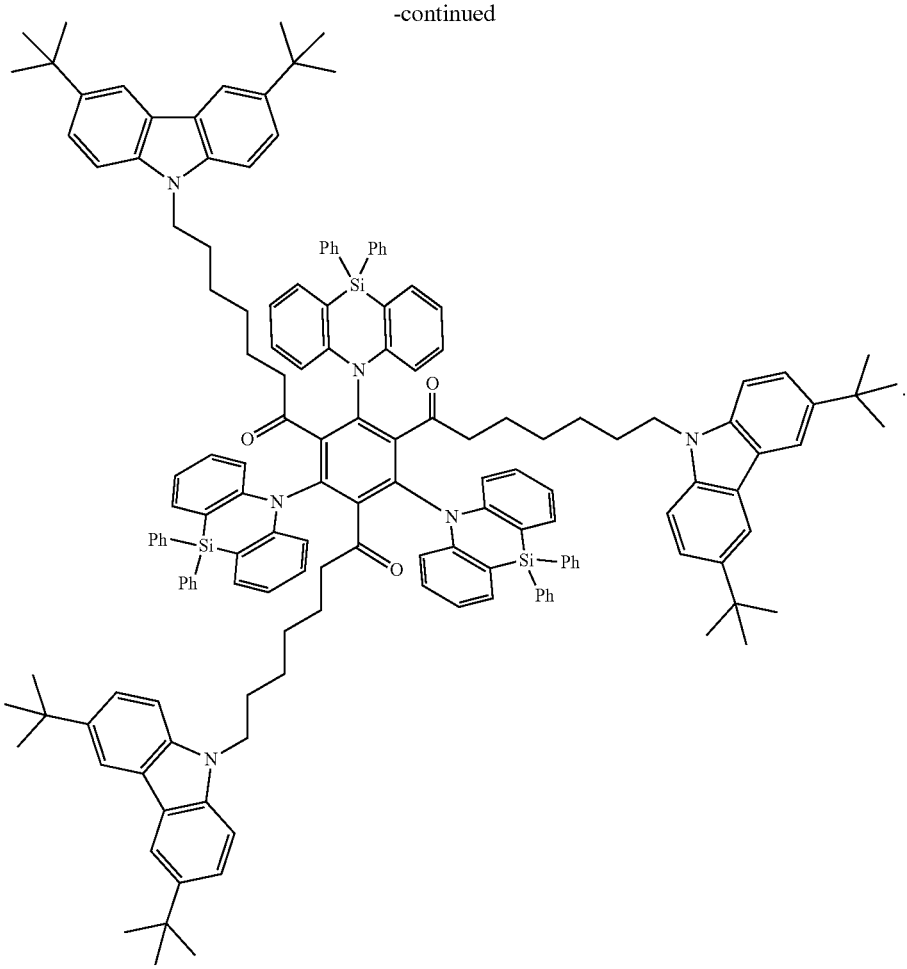

Formula 22

It should be noted that the second reactant having the chemical structure as shown in Formula 24 can be obtained by the following steps: first adding a first starting material (4.32 g, 20 mmol) having a chemical structure as shown in Formula 25, a second starting material (14.36 g, 60 mmol) having a chemical structure as shown in Formula 26, sodium hydroxide (2.4 g, 60 mmol), and 120 mL of tetrahydrofuran (THF) to a 250 mL two-necked flask for reaction at 60° C. for 24 hours and then cooling the reaction solution to room temperature; and pouring the reaction solution into 200 mL of ice water, followed by extraction with dichloromethane three times; and then combining organic extracts, followed by rotary distillation and column chromatography (dichloromethane:n-hexane, v:v, 1:1) for separation and purification to obtain 15.6 g of the second reactant having the chemical structure of Formula 24, which is a white powder, and the yield is 60%. A specific synthetic scheme is as follows:

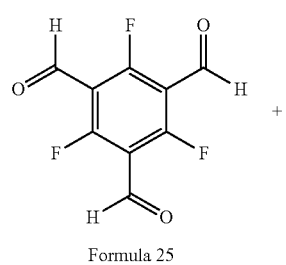

Formula 25

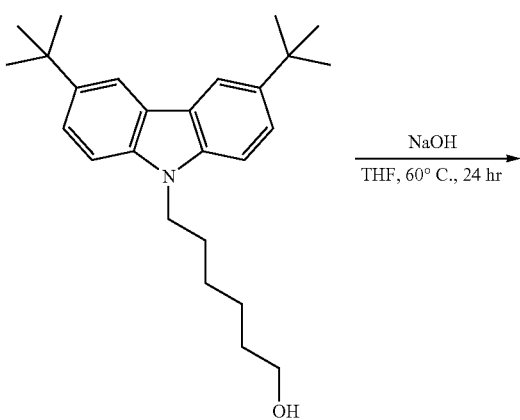

Formula 26

-continued

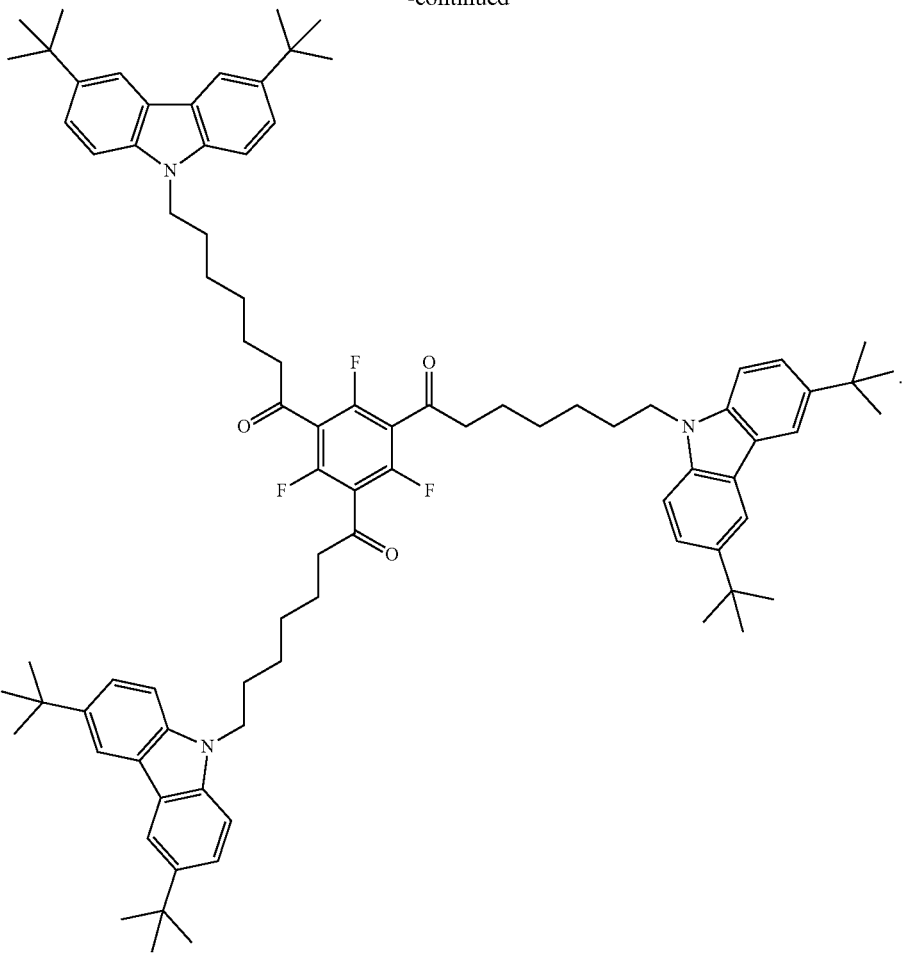

Formula 24

Figure 5:
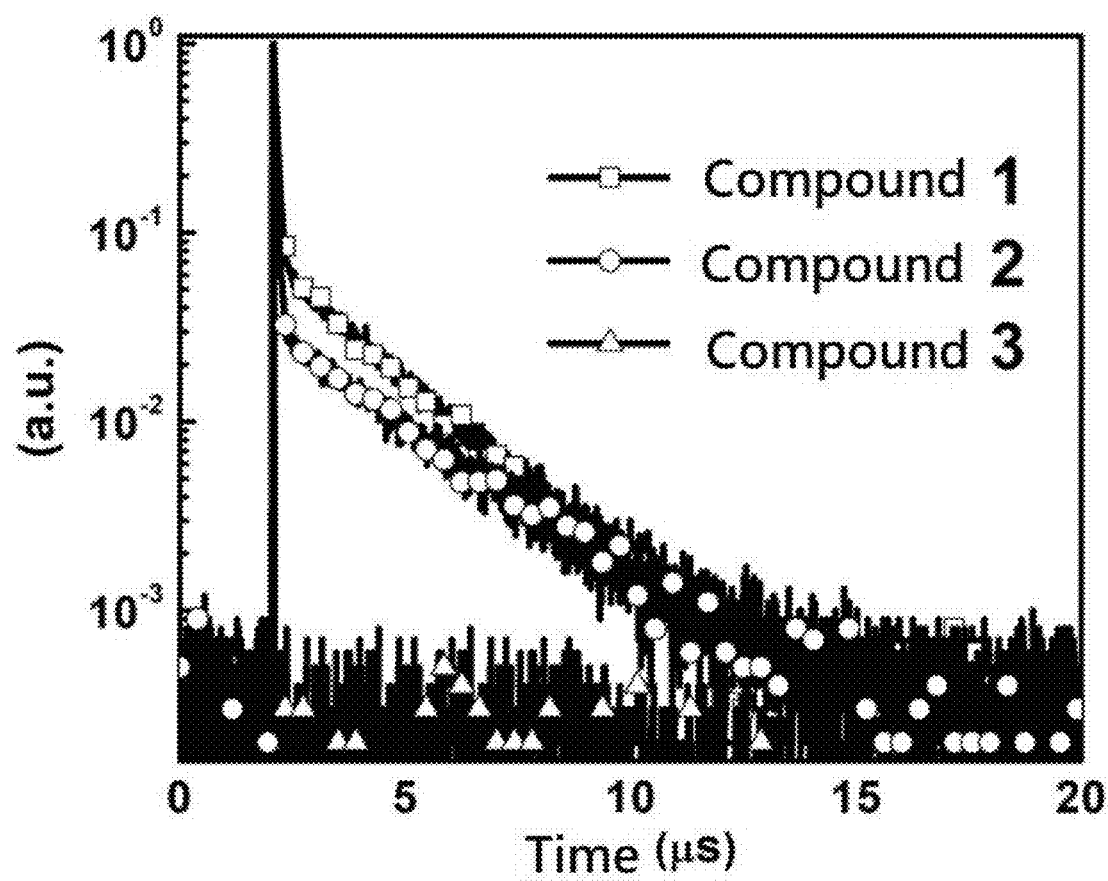
FIG. 5 shows a transient photoluminescence spectrum of the first to third embodiments of the present invention.

Specifically, a compound 1, a compound 2, and a compound 3 are defined as having chemical structures of Formula 20, Formula 21, and Formula 22, respectively, and Compound 1, Compound 2, and Compound 3 are examined to obtain a distribution of a highest occupied molecular orbital (HOMO) and a lowest unoccupied molecular orbital (LUMO) of Compound 1, Compound 2, and Compound 3, as shown in FIG. 5, and electrochemical energy states of Compound 1, Compound 2 and Compound 3 are shown in Table 1:

TABLE 1

| | PL Peak (nm) | $S_1$ (eV) | $T_1$ (eV) | $E_{ST}$ (eV) | HOMO (eV) | LUMO (eV) |
|---|---|---|---|---|---|---|
| Compound 1 | 470 | 2.64 | 2.55 | 0.09 | −5.31 | −2.13 |
| Compound 2 | 471 | 2.63 | 2.50 | 0.12 | −5.42 | −2.14 |
| Compound 3 | 476 | 2.61 | 2.50 | 0.11 | −5.42 | −2.13 |

Figure 3:
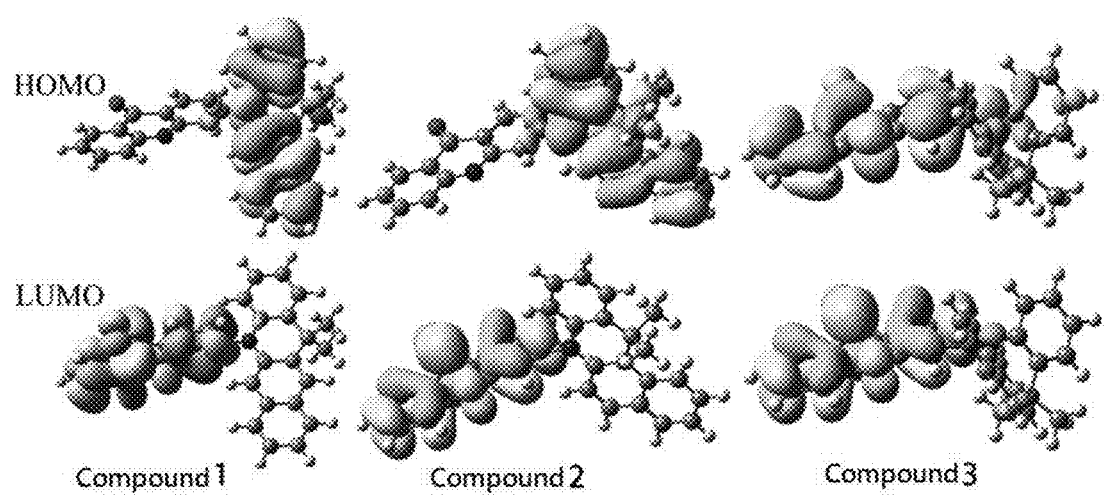
FIG. 3 shows a distribution diagram of highest occupied molecular orbital (HOMO) and lowest unoccupied molecular orbital (LUMO) of a first to third embodiments of the present invention.
Figure 4:
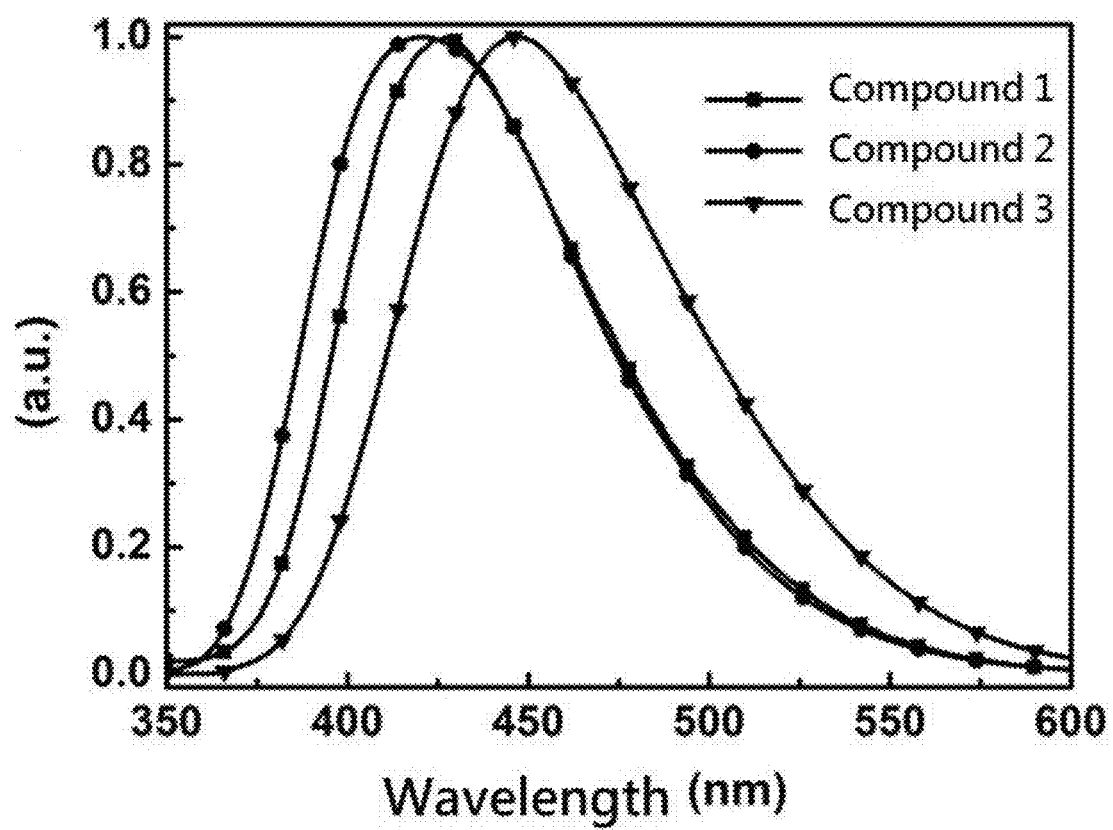
FIG. 4 shows a photoluminescence spectrum of the first to third embodiments of the present invention.

A PL peak is a photoluminescence peak, S1 is the lowest singlet energy state, Ti is the lowest triplet energy state, and ΔEST is the energy state difference between the lowest singlet energy state and the lowest triplet energy state. A photoluminescence spectrum of Compound 2 and Compound 3 in toluene solution at room temperature are shown in FIG. 4. The transient photoluminescence spectrum in the toluene solution at room temperature is shown in FIG. 5. As can be seen from FIGS. 3 to 5 and Table 1, the properties of Compound 1, Compound 2, and Compound 3 of the present invention comply with the requirements.

Further, the present invention also provides an electroluminescent device comprising the above-described blue light TADF material.

Figure 2:
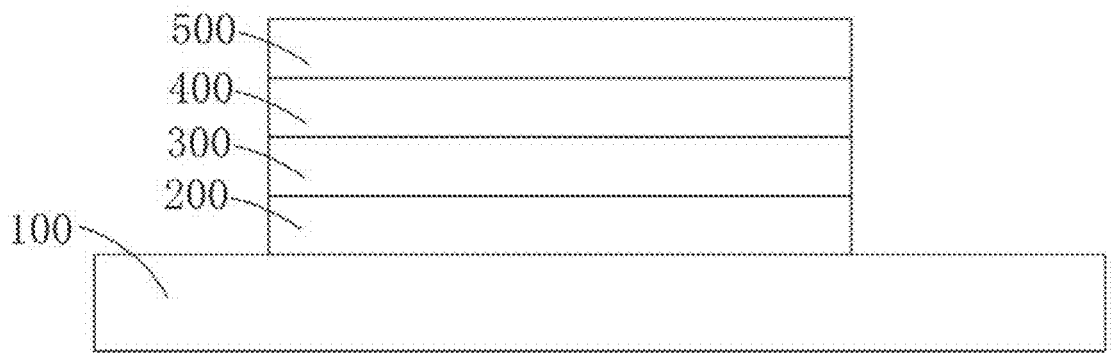
FIG. 2 is a structural view of an electroluminescent device of the present invention.

Referring to FIG. 2, the electroluminescent device specifically includes a substrate layer 100, a hole transport and injection layer 200, a light emitting layer 300, an electron transport layer 400, and a cathode layer 500, which are sequentially stacked, and the substrate layer 100 includes a glass substrate and an anode made of indium tin oxide (ITO) material on a glass substrate, and material of the hole transport and injection layer 200 is poly 3,4-ethylenedioxythiophene:polystyrene sulfonate (PEDOT:PSS). The light-emitting layer 300 is formed by a solution spin coating process using the blue light TADF material described above, and the material of the electron transport layer 400 is 1,3,5-tris(3-(3-pyridyl)phenyl)benzene (Tm3PyPB), and material of the cathode 500 is lithium fluoride and aluminum.

Specifically, Device 1, Device 2, and Device 3 are fabricated using Compound 1, Compound 2, and Compound 3 as the light-emitting layer 300, respectively, and the performance of Device 1, Device 2, and Device 3 are measured, wherein in Device 1, Device 2, and Device 3, the hole transport and injection layer 200 have a thickness of 50 nm, the light emitting layer 300 has a thickness of 40 nm, the electron transporting layer 400 has a thickness of 40 nm, while in the cathode 500, lithium fluoride has a thickness of 1 nm, and aluminum has a thickness of 100 nm. The performances of Device 1, Device 2, and Device 3 are shown in Table 2. It can be seen that the performances of Device 1, Device 2, and Device 3 meet the requirements.

TABLE 2

| Device | Maximum brightness (cd/m$^2$) | High current efficiency (cd/A) | CIEy | Maximum external quantum efficiency (%) |
|---|---|---|---|---|
| Device 1 | 6734 | 34.5 | 0.15 | 20.7 |
| Device 2 | 5745 | 36.4 | 0.15 | 21.6 |
| Device 3 | 6065 | 41.8 | 0.20 | 22.9 |

In summary, the present invention provides a blue light TADF material, which achieves high luminous efficiency and TADF efficiency to realize excellent solubility by attaching an alkyl chain for increasing solubility to a periphery of the blue light TADF material, and by attaching a tert-butylcarbazole unit having a high energy state to an end of the alkyl chain of the blue light TADF material, thereby allowing the material to be processed by solution spin coating, and the terminal carbazole can act as a host, enabling non-doping of the luminescent layer while effectively avoiding phase separation. The present invention also provides a method of preparing a blue light TADF material, which has high synthesis efficiency, and the obtained blue light TADF material has remarkable TADF characteristics and can be processed by solution spin coating. The present invention still provides an electroluminescent device having high luminous efficiency with a low production cost.

While the invention has been described in detail and with reference to specific embodiments thereof, it is to be understood that the foregoing description is exemplary and explanatory in nature and is intended to illustrate the invention and its preferred embodiments. Through routine experimentation, one skilled in the art will readily recognize that various changes and modifications can be made therein without departing from the spirit and scope of the invention.

What is claimed is:

1. A blue light thermally activated delayed fluorescence (TADF) material, comprising a structure of generic Formula 1:

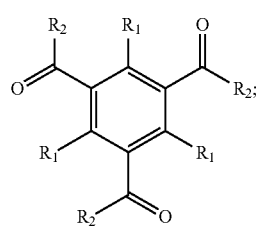

Formula 1 wherein $R_1$ is one of chemical structures of Formula 2 to Formula 14:

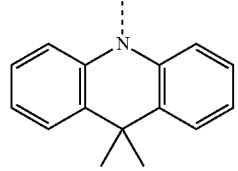

Formula 2

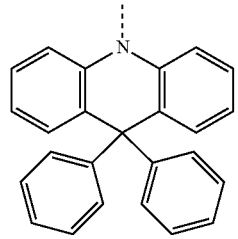

Formula 3

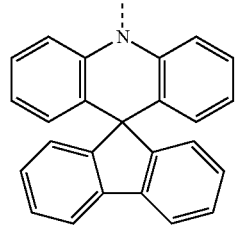

Formula 4

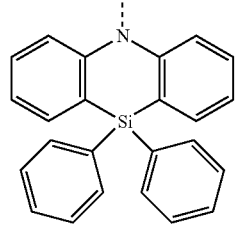

Formula 5

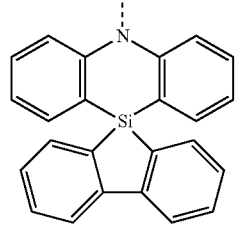

Formula 6

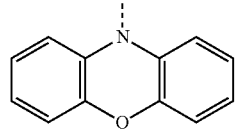

Formula 7

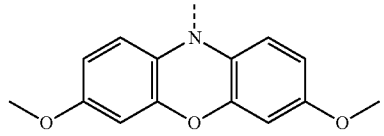

Formula 8

-continued
Formula 9
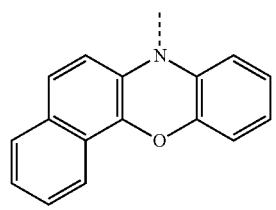
Formula 10
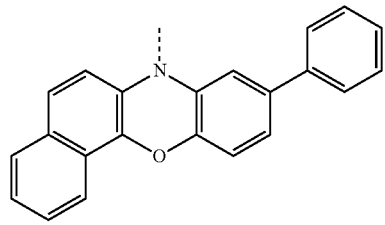
Formula 11
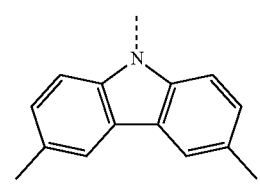
Formula 12
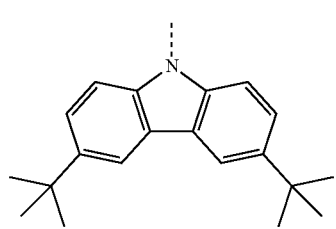
Formula 13
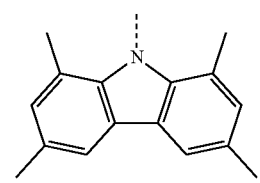
Formula 14
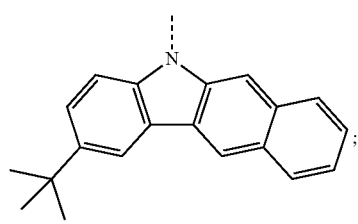
;
$R_2$ is one of chemical structures of Formula 15 to Formula 19.
Formula 15
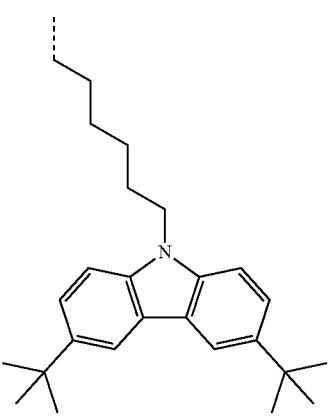
Formula 16
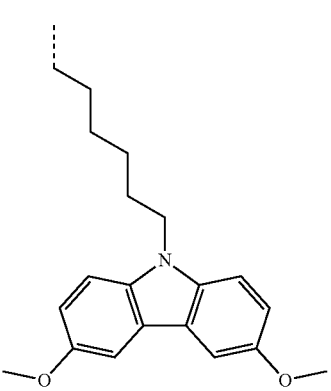
Formula 17
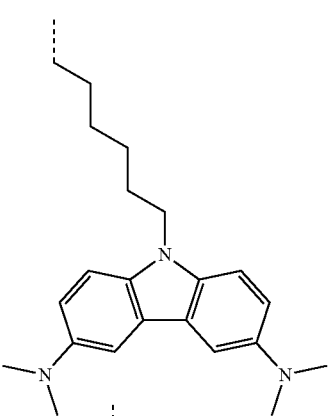
Formula 18
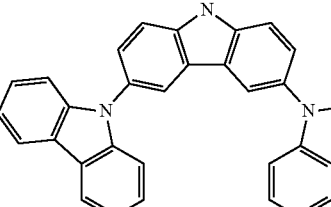

Formula 19
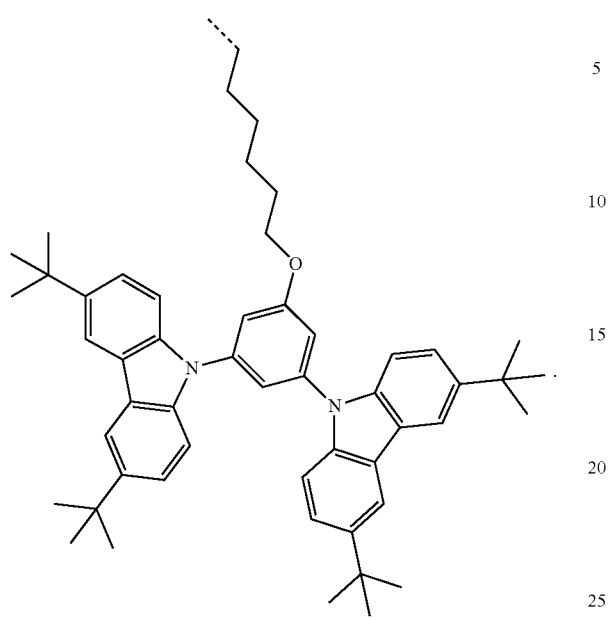
2. The blue light TADF material of claim 1, wherein the blue light TADF material has one of structures of Formula 20 to Formula 22:
Formula 20
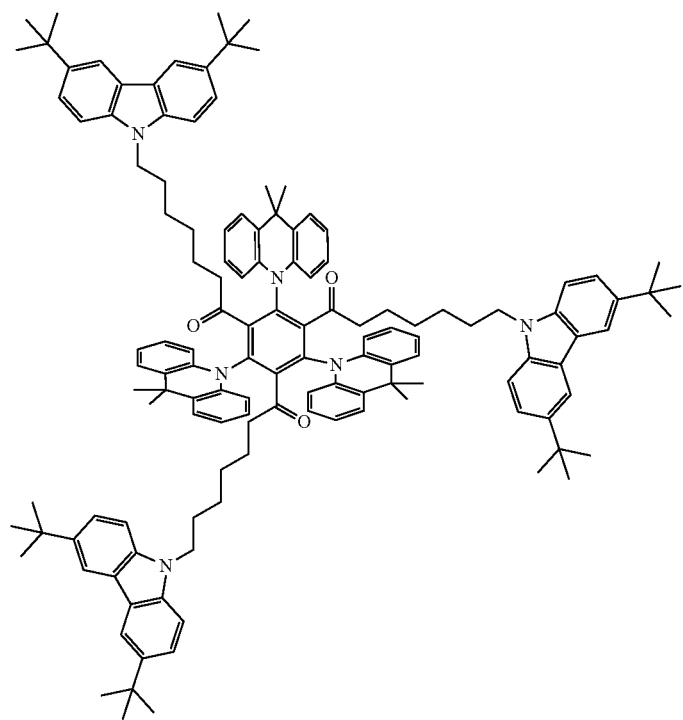

Formula 21
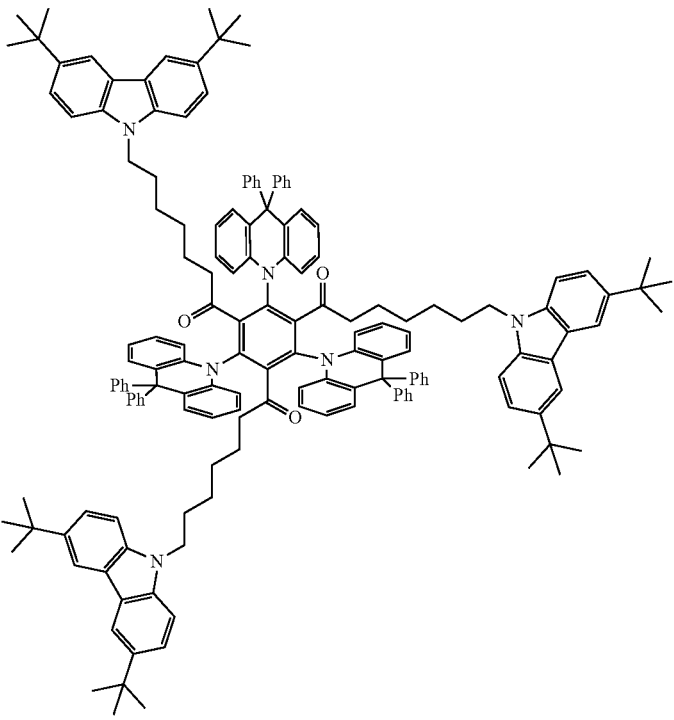
Formula 22
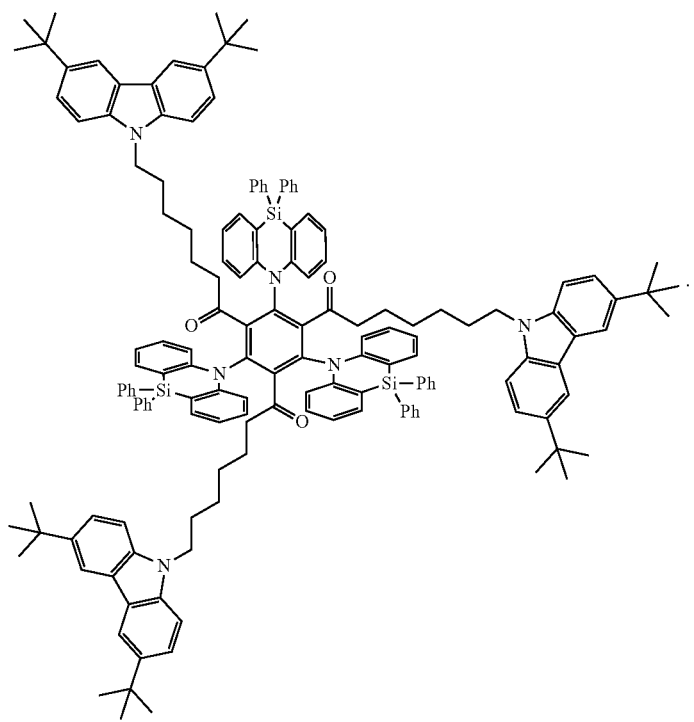

3. The blue light TADF material of claim 1, wherein the blue light TADF material is processable by solution spin coating.

4. A method of preparing a blue light thermally activated delayed fluorescence (TADF) material, comprising the following steps:

Step S1, providing a reaction vessel, and adding a first reactant $R_1$ to the reaction vessel, wherein the first reactant $R_1$ has one of chemical structures of Formula 2 to Formula 14:

Formula 2

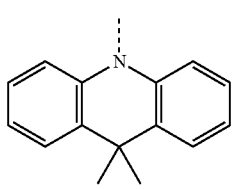

Formula 3

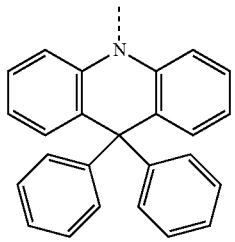

Formula 4

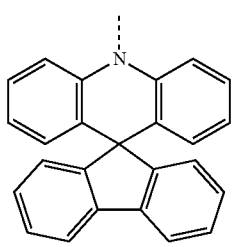

Formula 5

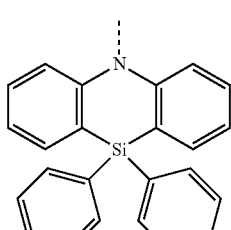

Formula 6

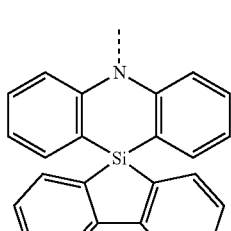

Formula 7

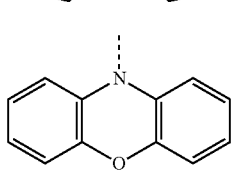

-continued

Formula 8

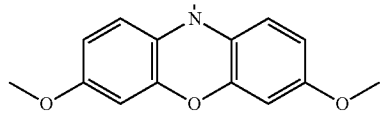

Formula 9

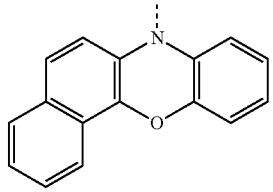

Formula 10

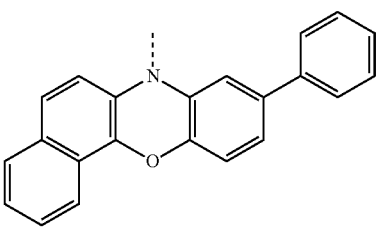

Formula 11

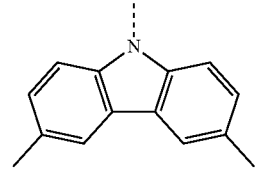

Formula 12

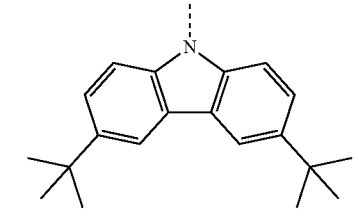

Formula 13

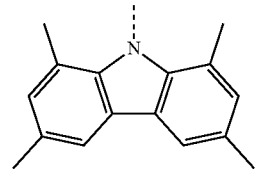

Formula 14

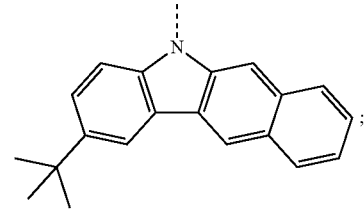

Step S2, removing air in the reaction vessel, and adding sodium hydride and tetrahydrofuran to the reaction vessel for reaction at a first temperature for a first period of time;

Step S3, providing a second reactant, and adding the second reactant to the reaction vessel for reaction for a second period of time to obtain a reaction solution, wherein the second reactant has a chemical structure of generic Formula 23;

Formula 23

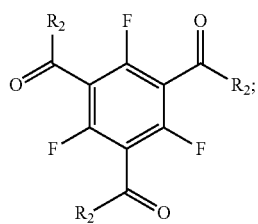

wherein R₂ has one of chemical structures of Formula 15 to Formula 19:

Formula 15

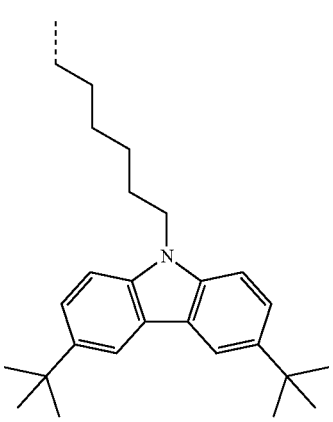

Formula 16

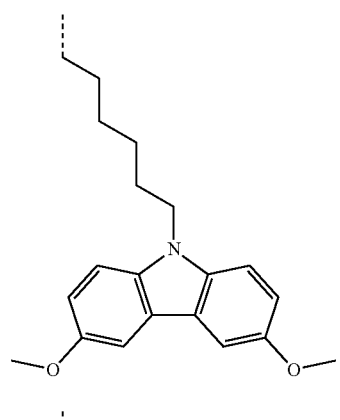

Formula 17

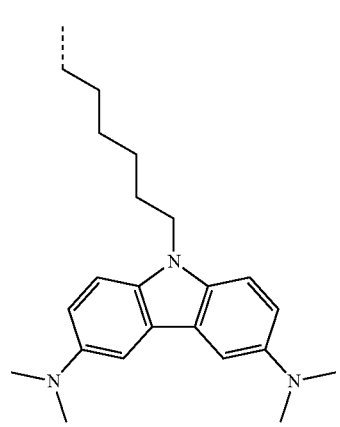

Formula 18

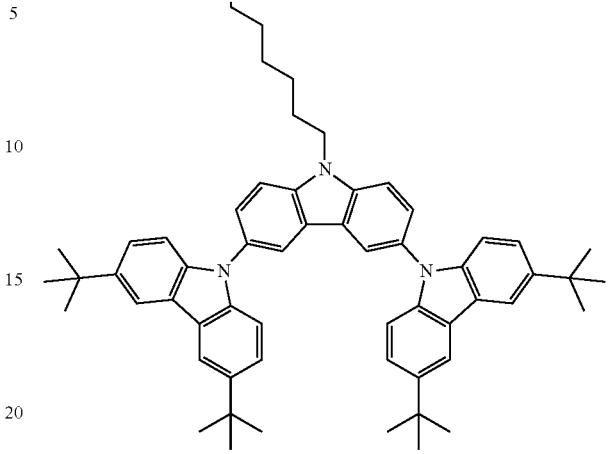

Formula 19

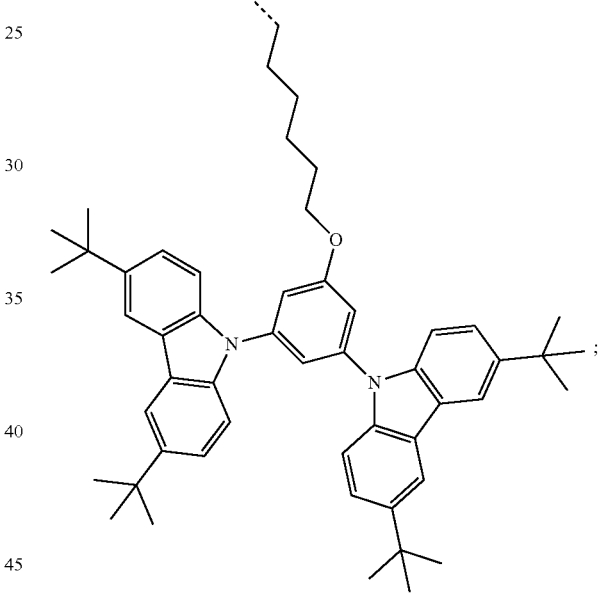

Step S4, pouring the reaction solution into water, followed by a series of separation and purification comprising extraction, combining organic extract, rotary distillation, and column chromatography to obtain a blue light TADF material, wherein the blue light TADF material has a structure of a generic formula as follows:

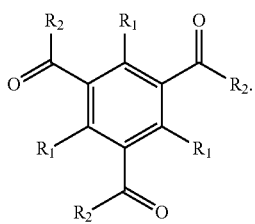

5. The method of producing the blue light TADF material according to claim 4, wherein the first temperature is from 55° C. to 65° C. and the first period of time is from 1.5 hours to 2.5 hours.

6. The method of preparing the blue light TADF material according to claim 4, wherein the second period of time is from 22 hours to 26 hours.

7. The method of preparing the blue light TADF material according to claim 4, wherein the extraction is carried out using dichloromethane in the step S4.

8. The method of preparing the blue light TADF material according to claim 4, wherein the blue TADF material obtained in the step S4 is processable by solution spin coating.

9. An electroluminescent device comprising the blue light thermally activated delayed fluorescence (TADF) material of claim 1.

10. The electroluminescent device according to claim 9, wherein the blue light TADF material has one of structures of Formula 20 to Formula 22:

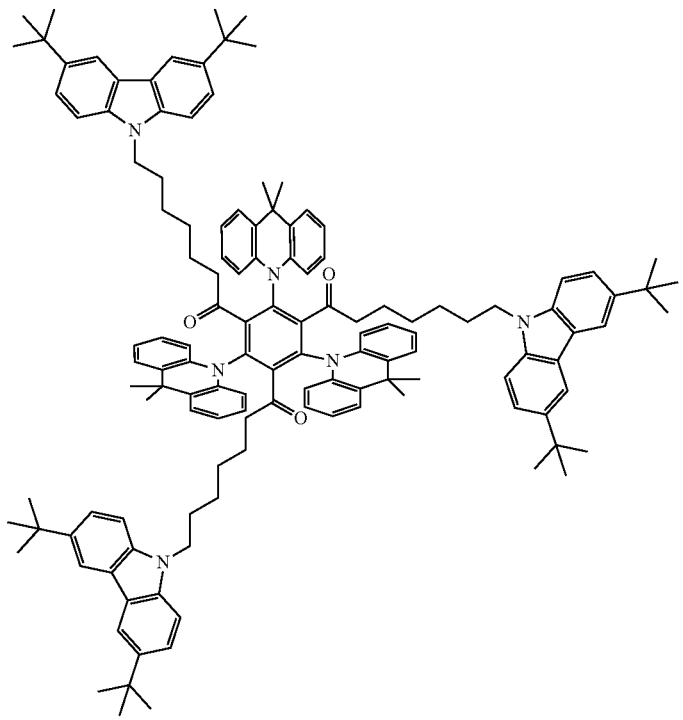

Formula 20

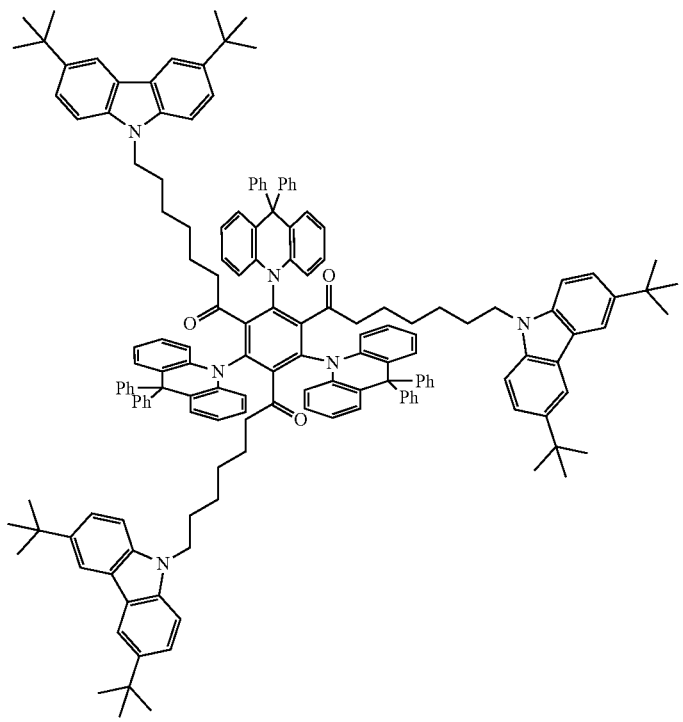

Formula 21

Formula 22
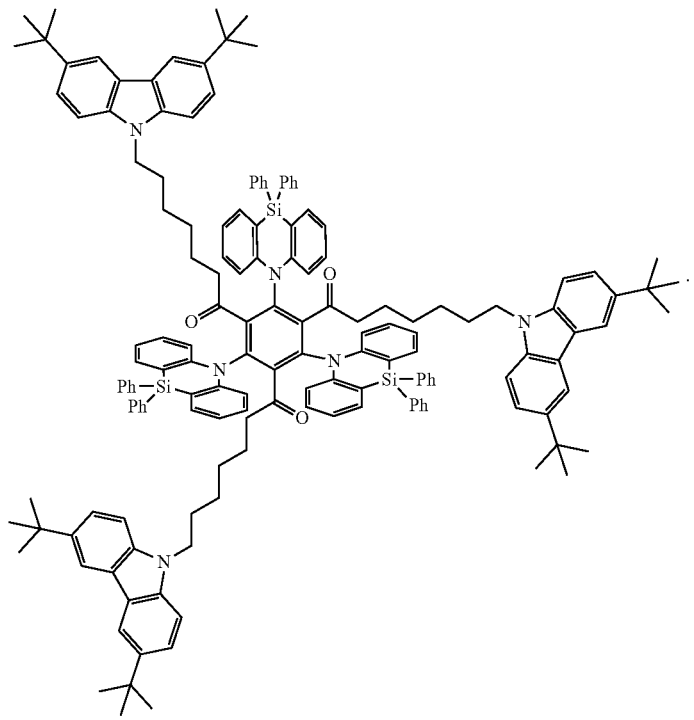
11. The electroluminescent device according to claim 9, wherein the blue TADF material is processable by solution spin coating.
12. The electroluminescent device according to claim 9, comprising a light-emitting layer fabricated by using the blue light TADF material.
* * * * *